(12) United States Patent
Takahashi et al.

(10) Patent No.: US 7,754,110 B2
(45) Date of Patent: Jul. 13, 2010

(54) INDIUM-OXIDE-BASED TRANSPARENT CONDUCTIVE FILM AND METHOD FOR PRODUCING THE FILM

(75) Inventors: Seiichiro Takahashi, Ageo (JP); Norihiko Miyashita, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 296 days.

(21) Appl. No.: 11/886,071

(22) PCT Filed: Apr. 2, 2007

(86) PCT No.: PCT/JP2007/057401
§ 371 (c)(1),
(2), (4) Date: Sep. 11, 2007

(87) PCT Pub. No.: WO2007/114429
PCT Pub. Date: Oct. 11, 2007

(65) Prior Publication Data
US 2009/0267029 A1 Oct. 29, 2009

(30) Foreign Application Priority Data
Mar. 31, 2006 (JP) .............................. 2006-101203
Mar. 30, 2007 (JP) .............................. 2007-095783

(51) Int. Cl.
*H01B 1/08* (2006.01)
*C23C 14/08* (2006.01)
*B05D 5/12* (2006.01)

(52) U.S. Cl. .............................. 252/520.1; 204/192.29; 204/298.13

(58) Field of Classification Search .............. 252/518.1, 252/520.1; 204/192.15, 192.17, 192.29, 204/298.13
See application file for complete search history.

(56) References Cited

U.S. PATENT DOCUMENTS

2008/0054794 A1* 3/2008 Hatanaka et al. ............ 313/504

FOREIGN PATENT DOCUMENTS

| JP | 6-290641 A | 10/1994 |
| JP | 8-188465 A | 7/1996 |
| JP | 2004-149883 A | 5/2004 |
| JP | 2005-135649 A | 5/2005 |
| WO | WO2009/044898 A1 * | 4/2009 |

OTHER PUBLICATIONS

English translation of JP 2004-149883 (ref listed on 1449).*
English translation of JP 06-290641 (ref listed on 1449).*

* cited by examiner

*Primary Examiner*—Mark Kopec
(74) *Attorney, Agent, or Firm*—Sughrue Mion, PLLC

(57) ABSTRACT

The invention provides a transparent conductive film which exhibits low resistance and high transmittance, is an amorphous film, can be relatively readily patterned by etching with a weak acid, and can be relatively readily crystallized, and a method for producing the film.

The transparent conductive film deposited from a sputtering target containing a sintered oxide including indium oxide, barium, and, in accordance with needs, tin, characterized in that the film contains indium oxide, barium, and, in accordance with needs, tin.

20 Claims, 19 Drawing Sheets

After annealing at 300°C

Before annealing

After annealing at 300°C

Before annealing

After annealing at 300℃

Before annealing

A7(Sn=0.05-Ba=0.02)

A9(Sn=0.05-Ba=0.05)

A13(Sn=0.075-Ba=0.02)

A20(Sn=0.10-Ba=0.005)

A21(Sn=0.10-Ba=0.01)

A22(Sn=0.10-Ba=0.02)

A23(Sn=0.10-Ba=0.03)

A31(Sn=0.15-Ba=0.005)

A32(Sn=0.15-Ba=0.01)

A33(Sn=0.15-Ba=0.02)

A40(Sn=0.20-Ba=0.001)

A42(Sn=0.20-Ba=0.005)

A43(Sn=0.20-Ba=0.01)

A58(Sn=0.30-Ba=0.005)

A59(Sn=0.30-Ba=0.01)

A60(Sn=0.30-Ba=0.02)

(a)

A4(Sn=0.05-Ba=0.002)

(b)

A6(Sn=0.05-Ba=0.01)

(c)

A35(Sn=0.15-Ba=0.05)

INDIUM-OXIDE-BASED TRANSPARENT CONDUCTIVE FILM AND METHOD FOR PRODUCING THE FILM

TECHNICAL FIELD

The present invention relates to a transparent conductive film which is an amorphous film, can be readily patterned by etching with a weak acid, exhibits low resistance and high transmittance, and can be readily crystallized, and to a method for producing the film.

BACKGROUND ART

Indium oxide-tin oxide ($In_2O_3$—$SnO_2$ compound oxide, hereinafter abbreviated as "ITO") film is a transparent conductive film which has high optical transparency with respect to visible light and high conductivity and which, therefore, finds a wide variety of uses, such as a liquid crystal display, a heat-generating film for defogging a glass panel, and an IR-reflecting film. However, difficulty is encountered in depositing such a transparent conductive film in an amorphous state.

Meanwhile, indium oxide-zinc oxide (IZO) transparent conductive film, which is known as an amorphous film, has a drawback in that the film exhibits a transparency lower than that of ITO film and tends to be yellowed.

In order to overcome the drawbacks, the present inventor previously proposed an amorphous transparent conductive film produced through adding silicon to a transparent ITO film and deposited under predetermined conditions (see Patent Document 1). However, when silicon is added to a transparent conductive film, resistance of the film tends to increase, which is problematic.

Patent Document 1: Japanese Patent Application Laid-Open (kokai) No. 2005-135649 (claims)

DISCLOSURE OF THE INVENTION

Problems to be Solved by the Invention

In view of the foregoing, an object of the present invention is to provide a transparent conductive film which is an amorphous film, can be readily patterned by etching with a weak acid, exhibits low resistance and high transmittance, and can be readily crystallized. Another object of the invention is to provide a method for producing the film.

Means for Solving the Problems

The present inventor has conducted extensive studies in order to overcome the aforementioned drawbacks, and has found that an indium oxide-based transparent conductive film to which barium has been added is a low-resistance and high-transparency amorphous film, can be readily patterned by etching with a weak acid, and can be readily crystallized. The present invention has been accomplished on the basis of this finding.

In a first mode of the present invention for attaining the aforementioned objects, there is provided a transparent conductive film deposited from a sputtering target comprising a sintered oxide including indium oxide, barium, and, in accordance with needs, tin, characterized in that the film comprises indium oxide, barium, and, in accordance with needs, tin.

According to the first mode, there can be produced an indium-oxide-based transparent conductive film containing barium. The film exhibits low resistance and high transparency, and the as-deposited film is in an amorphous state and can be etched with a weakly acidic etchant.

A second mode of the present invention is directed to a specific embodiment of the transparent conductive film of the first mode, which is deposited from a sputtering target containing barium in an amount of 0.00001 mol or more and less than 0.10 mol, with respect to 1 mol of indium.

According to the second mode including addition of a predetermined amount of barium, there can be deposited, among others, a transparent conductive film which exhibits low resistance and high transparency, is an amorphous film, and can be readily patterned by etching with a weak acid.

A third mode of the present invention is directed to a specific embodiment of the transparent conductive film of the first or second mode, which is deposited from a sputtering target containing tin in an amount of 0 to 0.3 mol, with respect to 1 mol of indium.

According to the third mode, there can be deposited a transparent conductive film containing indium oxide as a predominant component and, in accordance with needs, tin.

A fourth mode of the present invention is directed to a specific embodiment of the transparent conductive film of any of the first to third modes, which exhibits a resistivity of $1.0\times10^{-4}$ to $1.0\times10^{-3}$ Ωcm.

According to the fourth mode, the transparent conductive film exhibits a predetermined resistivity.

A fifth mode of the present invention is directed to a specific embodiment of the transparent conductive film of any of the first to fourth modes, which has been deposited in an amorphous state.

According to the fifth mode, the as-deposited amorphous film can be etched with a weak acid.

A sixth mode of the present invention is directed to a specific embodiment of the transparent conductive film of any of the first to fifth modes, which has been deposited in an amorphous state, and, subsequently, crystallized through annealing.

According to the sixth mode, the as-deposited amorphous film can be readily crystallized through annealing, and the annealed film can be imparted with resistance to weak acid.

A seventh mode of the present invention is directed to a specific embodiment of the transparent conductive film of the sixth mode, which has been crystallized through annealing at 100 to 400° C.

According to the seventh mode, the amorphous film can be readily crystallized at 100 to 400° C.

An eighth mode of the present invention is directed to a specific embodiment of the transparent conductive film of the sixth or seventh mode, which exhibits, after crystallization through annealing, an average transmittance at a wavelength of 400 to 500 nm of 85% or higher.

According to the eighth mode, the crystallized film is a highly transparent film having a predetermined average transmittance.

A ninth mode of the present invention is directed to a specific embodiment of the transparent conductive film of any of the first to eighth modes, wherein the ratio (y) by mole of tin to indium is $(-2.9\times10^{-2}Ln(x)-6.7\times10^{-2})$ or more and $(-2.0\times10^{-1}Ln(x)-4.6\times10^{-1})$ or less, wherein x represents a molar ratio of barium to indium, with the case of y=0 being excluded.

According to the ninth mode, an optimum oxygen partial pressure which provides a deposited amorphous film with the lowest resistivity differs from an oxygen partial pressure which provides a crystallized film obtained after undergoing annealing with the lowest resistivity (or from an optimum oxygen partial pressure for depositing an amorphous film at the annealing temperature). Thus, an amorphous film is deposited at an oxygen partial pressure at which low resistivity is attained after annealing and subsequently, the amorphous film is annealed, whereby a low-resistivity and high-transparency film can be deposited. In the subsequent steps, the thus-deposited film exhibits enhanced corrosion resistance, moisture resistance, and resistance to the environment.

A tenth mode of the present invention is directed to a specific embodiment of the transparent conductive film of any of the first to eighth modes, wherein the ratio (y) by mole of tin to indium is $(-2.9 \times 10^{-2} \text{Ln}(x) - 6.7 \times 10^{-2})$ or more and $(-2.0 \times 10^{-1} \text{Ln}(x) - 4.6 \times 10^{-1})$ or less, and is 0.22 or less, wherein x represents a molar ratio of barium to indium, with the case of y=0 being excluded.

According to the tenth mode, the deposited amorphous film can be etched at high etching rate, and the film is suitable for patterning.

An eleventh mode of the present invention is directed to a specific embodiment of the transparent conductive film of the tenth mode, wherein the ratio (y) by mole of tin to indium is $(5.9 \times 10^{-2} \text{Ln}(x) + 4.9 \times 10^{-1})$ or less, wherein x represents a molar ratio of barium to indium.

The amorphous film deposited in the eleventh mode can be etched at higher etching rate, and the film is suitable for patterning.

A twelfth mode of the present invention is directed to a specific embodiment of the transparent conductive film of the eleventh mode, wherein the ratio (y) by mole of tin to indium is 0.08 or more, and the ratio (x) by mole of barium to indium is 0.025 or less.

According to the twelfth mode, an amorphous film exhibits a remarkably low resistivity after annealing, and a resistivity of $3.0 \times 10^{-4}$ Ωcm or lower can be attained.

A thirteenth mode of the present invention provides a method for producing a transparent conductive film which is amorphous and which contains indium oxide, barium, and, in accordance with needs, tin, characterized in that the method comprises depositing a film from a sputtering target comprising a sintered oxide including indium oxide, barium, and, in accordance with needs, tin.

According to the thirteenth mode, a film is deposited from a sintered oxide including indium oxide, barium, and, in accordance with needs, tin. Therefore, there can be produced an indium-oxide-based transparent conductive film containing barium and exhibiting high transparency. The as-deposited film is in an amorphous state and can be etched with a weakly acidic etchant.

A fourteenth mode of the present invention is directed to a specific embodiment of the transparent conductive film production method of the thirteenth mode, wherein the film is deposited in an amorphous state, and, subsequently, the amorphous film is crystallized through annealing.

According to the fourteenth mode, the deposited amorphous film can be comparatively readily crystallized through annealing.

A fifteenth mode of the present invention is directed to a specific embodiment of the transparent conductive film production method of the fourteenth mode, wherein the amorphous film is etched with a weakly acidic etchant and, subsequently, crystallized through annealing.

According to the fifteenth mode, the amorphous film is etched with a weakly acidic etchant and, subsequently, crystallized through annealing, whereby the annealed film can be imparted with resistance to weak acid.

A sixteenth mode of the present invention is directed to a specific embodiment of the transparent conductive film production method of the fourteenth or fifteenth mode, wherein annealing for crystallization is performed at 100 to 400° C.

According to the sixteenth mode, the amorphous film can be readily crystallized at 100 to 400° C.

A seventeenth mode of the present invention is directed to a specific embodiment of the transparent conductive film production method of any of the fourteenth to sixteenth modes, wherein the transparent conductive film exhibits, after crystallization through annealing, an average transmittance at a wavelength of 400 to 500 nm of 85% or higher.

According to the seventeenth mode, transmittance in a shorter wavelength range is enhanced after crystallization, and a high-transparency film exhibiting a predetermined average transmittance can be produced.

An eighteenth mode of the present invention is directed to a specific embodiment of the transparent conductive film production method of any of the fourteenth to seventeenth modes, wherein the transparent conductive film exhibits a resistivity of $1.0 \times 10^{-4}$ to $1.0 \times 10^{-3}$ Ωcm.

According to the eighteenth mode, a transparent conductive film exhibiting a predetermined resistivity can be produced.

A nineteenth mode of the present invention is directed to a specific embodiment of the transparent conductive film production method of any of the thirteenth to eighteenth modes, wherein the film is deposited from a sputtering target having a molar ratio (y) of tin to indium of $(-2.9 \times 10^{-2} \text{Ln}(x) - 6.7 \times 10^{-2})$ or more and $(-2.0 \times 10^{-1} \text{Ln}(x) - 4.6 \times 10^{-1})$ or less, wherein x represents a molar ratio of barium to indium, with the case of y=0 being excluded.

According to the nineteenth mode, an optimum oxygen partial pressure which provides a deposited amorphous film with the lowest resistivity differs from an oxygen partial pressure which provides a crystallized film obtained after undergoing annealing with the lowest resistivity (or from an optimum oxygen partial pressure for depositing an amorphous film at the annealing temperature). Thus, an amorphous film is deposited at an oxygen partial pressure at which low resistivity is attained after annealing and subsequently, the amorphous film is annealed, whereby a low-resistivity and high-transparency film can be deposited. In the subsequent steps, the thus-deposited film exhibits enhanced corrosion resistance, moisture resistance, and resistance to the environment.

A twentieth mode of the present invention is directed to a specific embodiment of the transparent conductive film production method of any of the thirteenth to eighteenth modes, wherein the film is deposited from a sputtering target having a molar ratio (y) of tin to indium of $(-2.9 \times 10^{-2} \text{Ln}(x) - 6.7 \times 10^{-2})$ or more and $(-2.0 \times 10^{-1} \text{Ln}(x) - 4.6 \times 10^{-1})$ or less, and 0.22 or less, wherein x represents a molar ratio of barium to indium, with the case of y=0 being excluded.

According to the twentieth mode, the amorphous film can be etched at very high etching rate, and the film is suitable for patterning.

A twenty-first mode of the present invention is directed to a specific embodiment of the transparent conductive film production method of the twentieth mode, wherein the film is deposited from a sputtering target having a molar ratio (y) of tin to indium of $(5.9 \times 10^{-2} \text{Ln}(x) + 4.9 \times 10^{-1})$ or less, wherein x represents a molar ratio of barium to indium.

According to the twenty-first mode, the amorphous film can be etched at high etching rate, and the film is more suitable for patterning.

A twenty-second mode of the present invention is directed to a specific embodiment of the transparent conductive film production method of the twenty-first mode, wherein the film is deposited from a sputtering target having a molar ratio (y) of tin to indium of 0.08 or more, and a molar ratio (x) of barium to indium of 0.025 or less.

According to the twenty-second mode, the film exhibits a remarkably low resistivity after annealing, and a resistivity of $3.0 \times 10^{-4}$ Ωcm or lower can be attained.

A twenty-third mode of the present invention is directed to a specific embodiment of the transparent conductive film production method of any of the nineteenth to twenty-second mode, wherein, from the relationship between oxygen partial pressure for depositing a film and resistivity of the film which has undergone annealing, an oxygen partial pressure which provides annealed film with the lowest resistivity is derived, and film deposition is performed at the derived oxygen partial pressure.

According to the twenty-third mode, an amorphous film is deposited at an oxygen partial pressure which provides the annealed film with the lowest resistivity, and the amorphous film is crystallized through annealing, whereby a low-resistivity transparent conductive film can be produced.

Effects of the Invention

According to the present invention, a transparent conductive film is produced from indium oxide and barium as an additive. The thus-deposited film is amorphous, can be readily patterned by etching with a weak acid, exhibits low resistance and high transmittance, and can be readily crystallized.

BEST MODES FOR CARRYING OUT THE INVENTION

Figure 1:
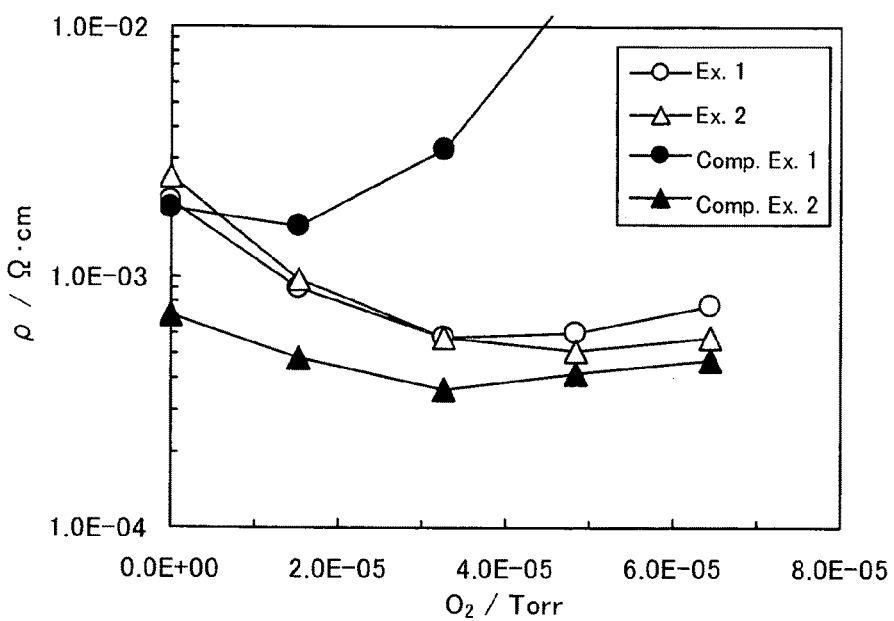
[FIG. 1] A graph showing the relationship between oxygen partial pressure and resistivity obtained in Examples 1 and 2 and Comparative Examples 1 and 2.
Figure 2:
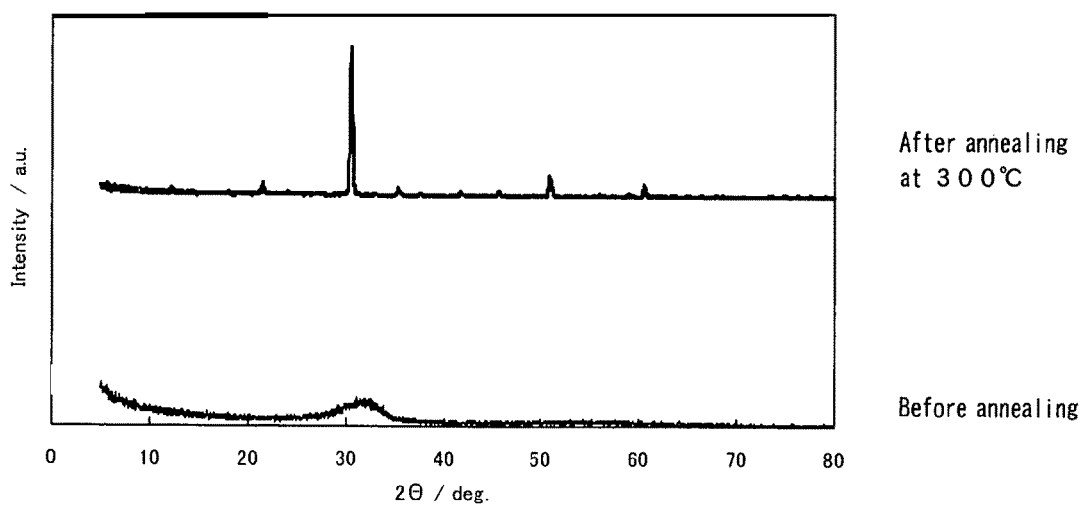
[FIG. 2] A chart showing thin-film XRD patterns of the sample of Example 1 before and after annealing.
Figure 3:
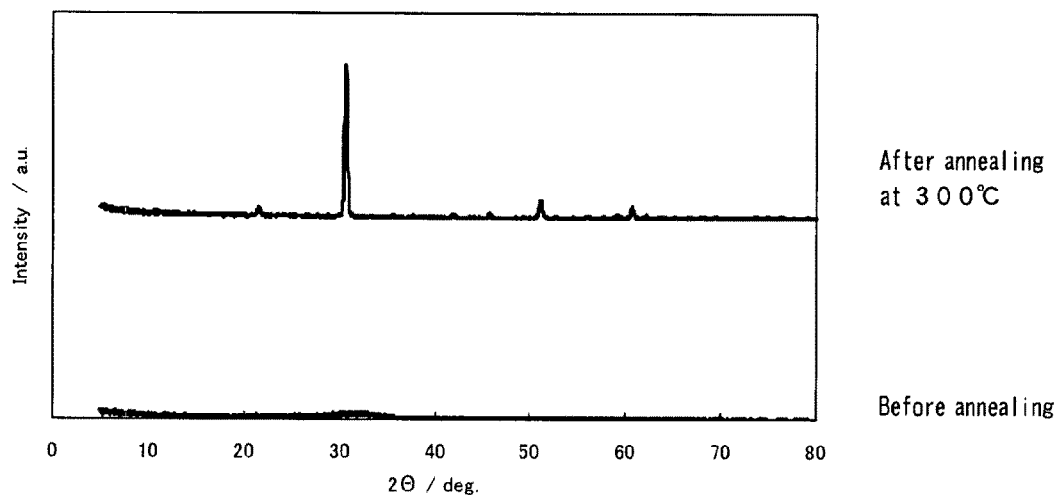
[FIG. 3] A chart showing thin-film XRD patterns of the sample of Example 2 before and after annealing.
Figure 4:
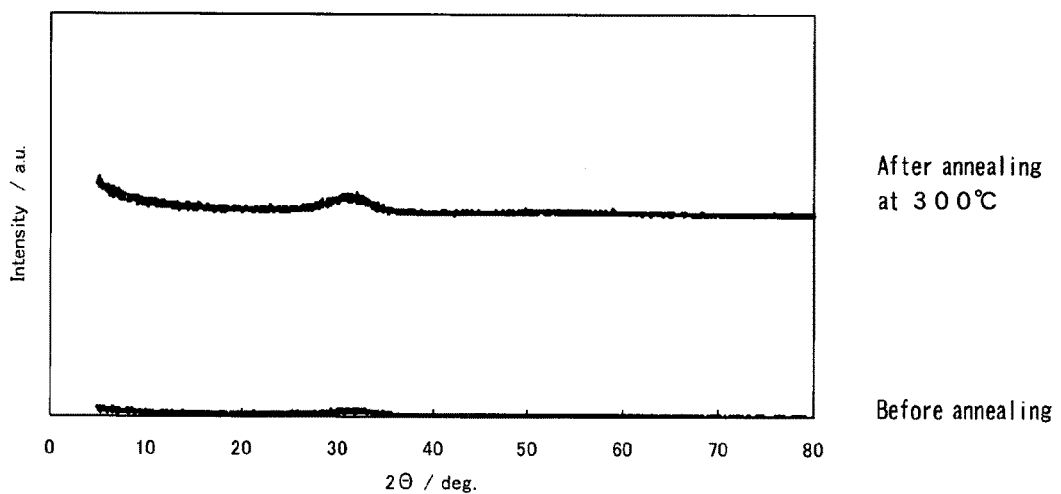
[FIG. 4] A chart showing thin-film XRD patterns of the sample of Comparative Example 1 before and after annealing.
Figure 5:
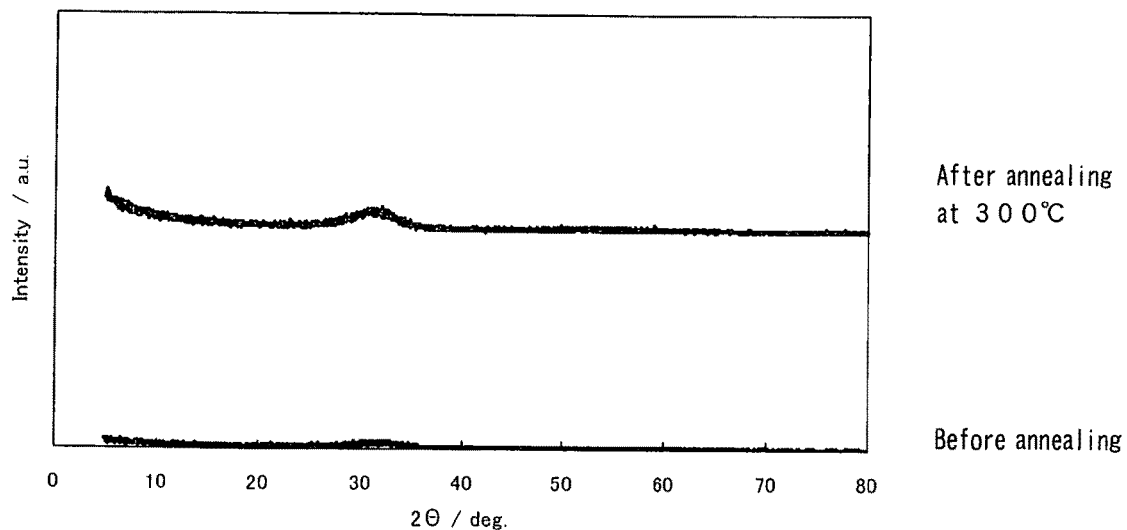
[FIG. 5] A chart showing thin-film XRD patterns of the sample of Comparative Example 2 before and after annealing.
Figure 6:
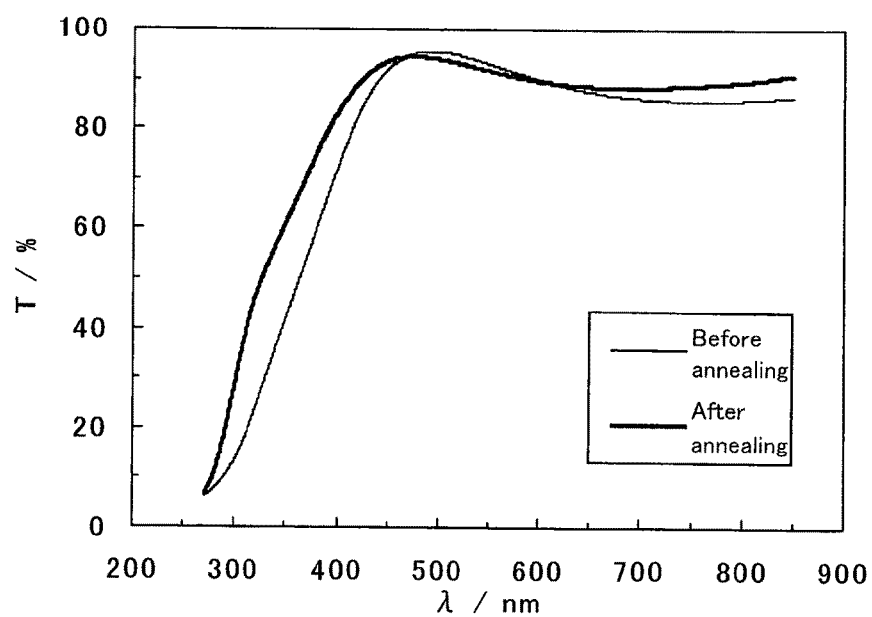
[FIG. 6] A chart showing transmission spectra of the sample of Example 1 before and after annealing.
Figure 7:
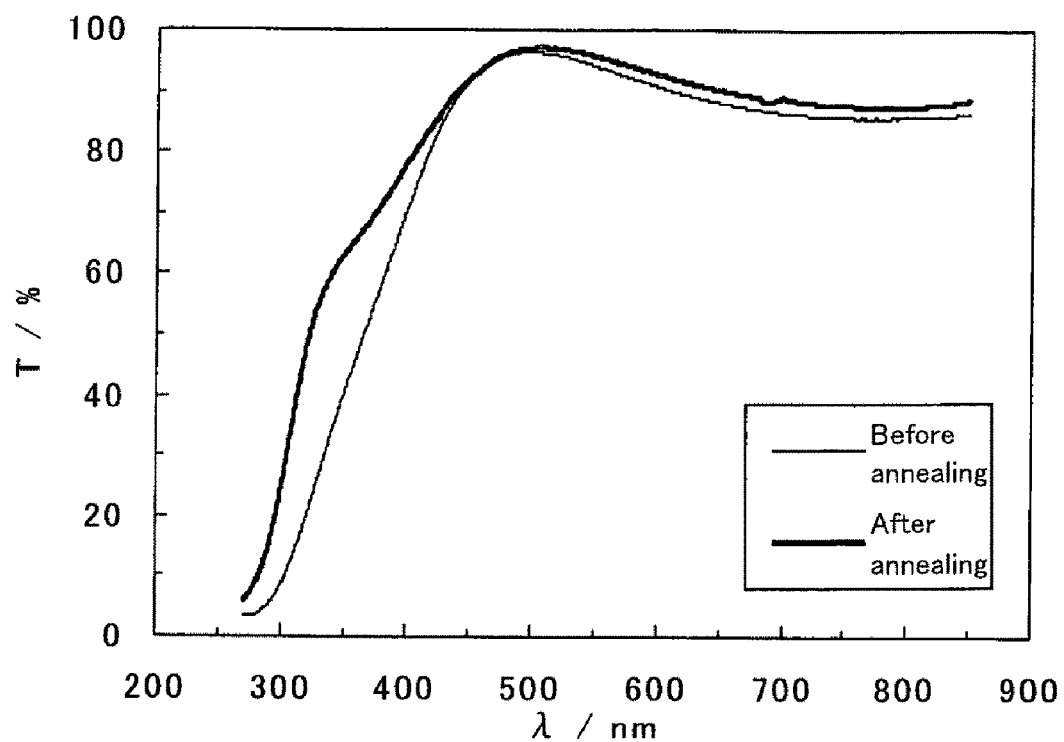
[FIG. 7] A chart showing transmission spectra of the sample of Example 2 before and after annealing.
Figure 8:
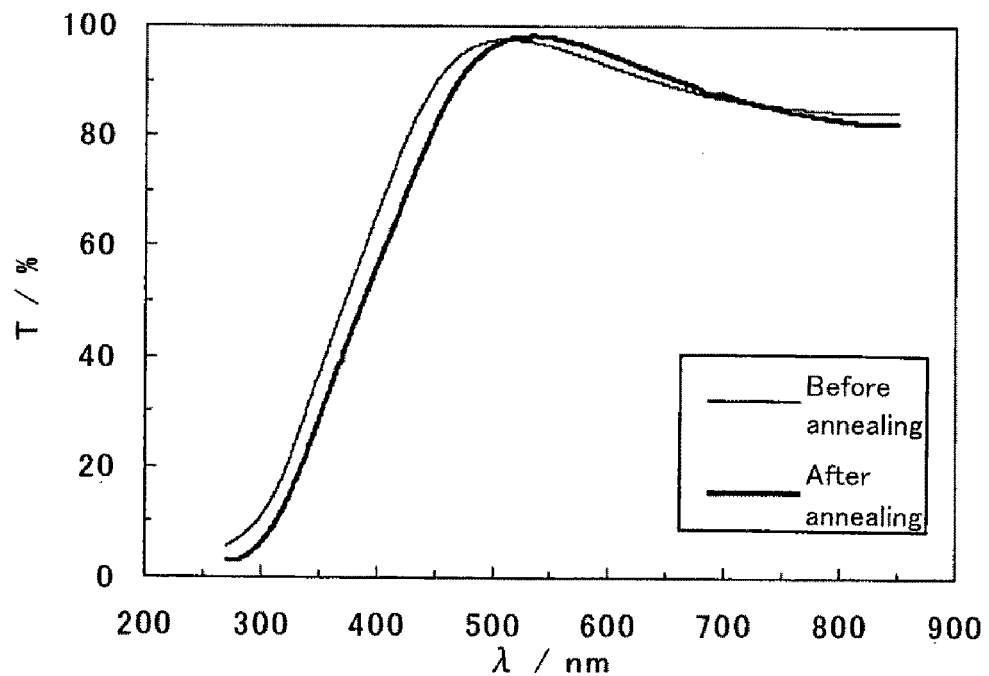
[FIG. 8] A chart showing transmission spectra of the sample of Comparative Example 1 before and after annealing.
Figure 9:
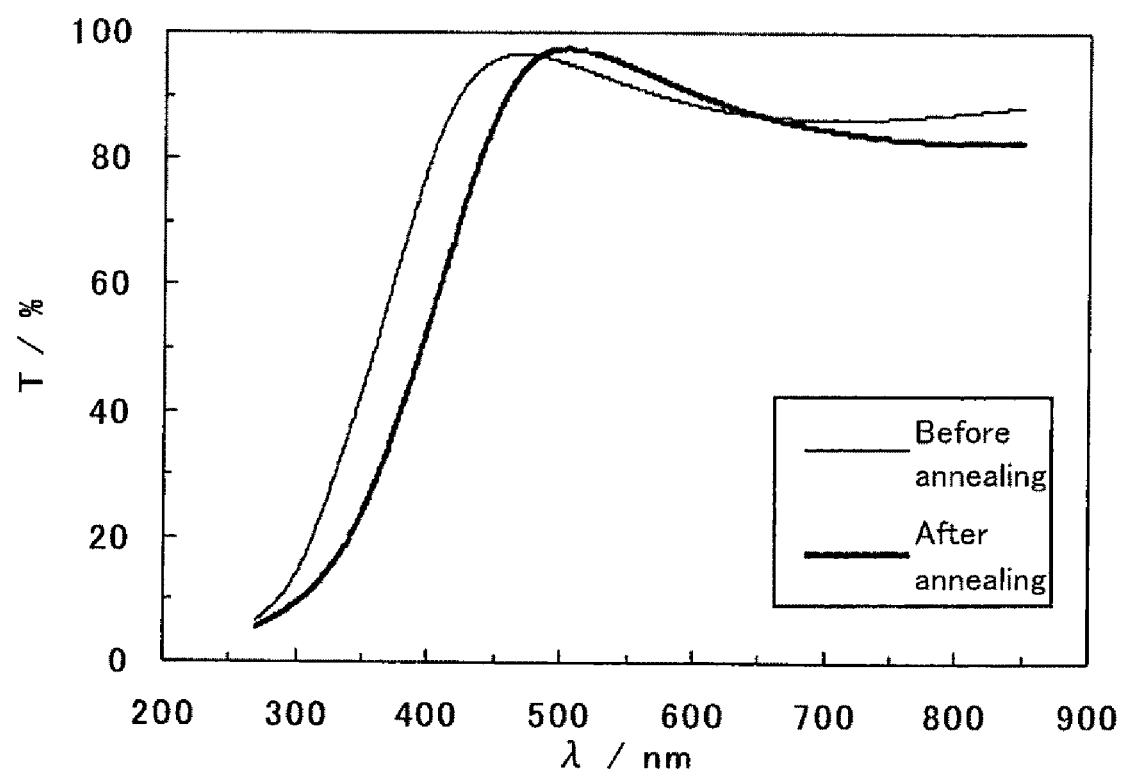
[FIG. 9] A chart showing transmission spectra of the sample of Comparative Example 2 before and after annealing.

The sputtering target of the present invention for use in deposition of an indium-oxide-based transparent conductive film is a sintered oxide containing indium oxide as a predominant component, tin as an optional component, and barium. No particular limitation is imposed on the form of barium species, and oxide, compound oxide, or solid solution may be acceptable.

The barium content of the sputtering target for depositing a transparent conductive film is preferably 0.00001 mol or more and less than 0.10 mol, with respect to 1 mol of indium. When the barium content falls below the lower limit, effect commensurate with addition is not significant, whereas when the barium content is in excess of the upper limit, the deposited film exhibits increased resistance and unfavorably colored. Notably, the barium content of the transparent conductive film deposited from the sputtering target is identical with that of the sputtering target employed.

The tin content of the sputtering target for depositing a transparent conductive film is 0 to 0.3 mol, with respect to 1 mol of indium. When tin is incorporated, the tin content of the sputtering target for depositing a transparent conductive film is preferably 0.001 to 0.3 mol, with respect to 1 mol of indium. When the tin content falls within the above range, density and mobility of carriers (electrons) in the sputtering target can be appropriately controlled, to thereby maintain conductivity of the target within an appropriate range. In contrast, when the tin content falls outside the range, mobility of carriers (electrons) in the sputtering target is decreased, and conductivity is impaired, which is not preferred. Notably, the tin content of the transparent conductive film deposited from the sputtering target is identical to that of the sputtering target employed.

The aforementioned sputtering target has such a low resistivity as to permit DC magnetron sputtering of the target. Therefore, the sputtering target can be employed in DC magnetron sputtering, which is a process performed at relatively low cost. Needless to say, the sputtering target may also be employed in a high-frequency magnetron sputtering apparatus.

Through employment of the sputtering target for depositing a transparent conductive film, an indium-oxide-based transparent conductive film having the same composition as that of the target can be deposited. The composition of such an indium-oxide-based transparent conductive film may be analyzed by dissolving the entirety of a single film and analyzing the solution through ICP. Alternatively, when the film itself forms a device element, a portion to be analyzed is cut in accordance with needs through FIB or a similar means, and may be analyzed by means of an elemental analyzer (EDS, WDS, Auger analyzer, etc.) attached to an SEM, a TEM, or a similar device.

Since the indium-oxide-based transparent conductive film of the present invention contains a predetermined amount of barium, the film is deposited within a temperature range of room temperature to crystallization temperature, depending on the barium content. For example, the film deposition temperature is 200° C. or lower, preferably 150° C. or lower, and more preferably 100° C. or lower. Through employment of such film deposition temperature, the film is deposited in an amorphous state. Such an amorphous film is advantageous in that the film can be etched with a weakly acidic etchant. In the present specification, the etching procedure is included in the patterning step and is carried out for forming a predetermined pattern.

The thus-deposited transparent conductive film has a resistivity, which varies depending on the barium content, of $1.0 \times 10^{-4}$ to $1.0 \times 10^{-3}$ Ωcm.

The crystallization temperature of the deposited film varies depending on the barium content and increases with barium content. The film may be crystallized through annealing at 100° C. to 400° C. Since such a temperature range is generally employed in semiconductor device production processes, crystallization may be performed in such a production process. Preferably, the film is crystallized at 100° C. to 300° C., more preferably at 150° C. to 250° C., and most preferably at 200° C. to 250° C.

As used herein, the term "annealing" refers to heating an object at a predetermined temperature for a predetermined period of time in a predetermined atmosphere including air or vacuum. The predetermined period of time is generally several minutes to several hours. From the industrial viewpoint, the period is preferably short, so long as the same effect can be attained.

The transparent conductive film crystallized through annealing exhibits enhanced transmittance within a short-wavelength region. For example, the film exhibits an average transmittance at a wavelength of 400 to 500 nm of 85% or higher. Therefore, yellowing of film, which is a problem generally occurring in IZO, can be prevented. Generally, a higher transmittance in a short-wavelength range is preferred.

The crystallized transparent conductive film has an enhanced etching resistance and cannot be etched with a weakly acidic etchant, which realizes etching of an amorphous film. Thus, the crystallized film exhibits enhanced corrosion resistance in the subsequent steps, and resistance of a device employing the film to environment is enhanced.

Thus, according to the present invention, through tuning the barium content, crystallization temperature of the deposited amorphous film can be predetermined as desired. Therefore, the deposited amorphous film may be maintained in an amorphous state through avoiding subjecting the film to a heat treatment at a temperature equal to or higher than the crystallization temperature. Alternatively, the deposited amorphous film may be patterned and, subsequently, treated at a temperature equal to or higher than the crystallization temperature, to thereby modify etching resistance.

The present inventor has found that, when a barium-containing indium-oxide-based transparent conductive film is deposited, the optimum oxygen partial pressure varies in accordance with the film deposition temperature and the compositional range of the sputtering target. That is, an amorphous film is deposited at such a temperature and an oxygen partial pressure that a low resistance of the annealed film is attained, and annealing the amorphous film for crystallization, to thereby form a low-resistance transparent conductive film.

Specifically, when the ratio (y) by mole of tin to indium is $(-2.9 \times 10^{-2} \mathrm{Ln}(x) - 6.7 \times 10^{-2})$ or more and $(-2.0 \times 10^{-1} \mathrm{Ln}(x) - 4.6 \times 10^{-1})$ or less (wherein x represents a molar ratio of barium to indium, and the case of y=0 is excluded), an optimum oxygen partial pressure which provides a deposited amorphous film with the lowest resistivity differs from an oxygen partial pressure which provides a crystallized film obtained after undergoing annealing with the lowest resistivity (or from an optimum oxygen partial pressure for depositing an amorphous film at the annealing temperature). Thus, when the mole ratio falls within the above range, it is advantageous that an amorphous film is deposited at an oxygen partial pressure at which low resistivity is attained after annealing, to thereby form a low-resistivity and transparent conductive film. Alternatively, a transparent conductive film exhibiting a predetermined resistance can be deposited at a lower oxygen concentration, which is advantageous.

Etching rate of the deposited film varies depending on the composition of the target. When the ratio (y) by mole of tin to indium is $(-2.9 \times 10^{-2} \mathrm{Ln}(x) - 6.7 \times 10^{-2})$ or more and $(-2.0 \times 10^{-1} \mathrm{Ln}(x) - 4.6 \times 10^{-1})$ or less, and is 0.22 or less (wherein x represents a molar ratio of barium to indium, and the case of y=0 is excluded), etching rate is considerably high. Although details are described hereinbelow, when an oxalic acid solution (50 g/L) heated at 30° C. is used as an etchant, the etching rate is 3 Å/sec or higher. When the ratio (y) by mole of tin to indium is $(5.9 \times 10^{-2} \mathrm{Ln}(x) + 4.9 \times 10^{-1})$ or less (wherein x represents a molar ratio of barium to indium), etching rate further increases. When an oxalic acid solution (50 g/L) heated at 30° C. is used as an etchant, the etching rate is 4 Å/sec or higher. When the etching rate falls within the range, a clear pattern is formed through patterning. Notably, the upper limit of the etching rate is generally considered about 30 Å/sec.

The present inventor has found that, when the target has such a composition that a high etching rate is attained, low resistance of the deposited film can be attained within a specific compositional range. Specifically, when a high etching rate is attained, in the case where the ratio (y) by mole of tin to indium is 0.08 or more, and the ratio (x) by mole of barium to indium is 0.025 or less, the deposited transparent conductive film exhibits a resistivity of $3.0\times10^{-4}$ Ωcm or lower, which is advantageous.

Therefore, through employment of a sputtering target having a composition falling within the aforementioned range, or through deposition of a transparent conductive film having such a composition, an amorphous transparent conductive film which can be etched at high etching rate can be deposited, and after crystallization, the deposited transparent conductive film exhibits excellent etching resistance and low electrical resistance.

Next, the method for producing the sputtering target employed in the present invention will be described. However, the method is not particularly limited to the following procedure, which is merely an exemplary method.

Generally, the starting materials for depositing the sputtering target employed in the present invention are $In_2O_3$, $SnO_2$, $BaCO_3$, in the powder form. Preferably, $In_2O_3$ and $BaCO_3$ are calcined in advance, to thereby form $BaIn_2O_4$, and the compound oxide, $In_2O_3$, and $SnO_2$ are mixed together, to thereby provide a starting mixture. Use of the calcined product prevents pores caused by gas generated through decomposition of $BaCO_3$. The staring materials may be in the form of element, compound, compound oxide, etc. The element or compound form materials are subjected to an oxidation process before use thereof.

No particular limitation is imposed on the methods of mixing the raw material powders in desired proportions and of compacting the mixture. The resultant mixture is compacted through any of conventionally known wet methods and dry methods.

Examples of the dry method include the cold press method and the hot press method. The cold press method includes charging a powder mixture into a mold to form a compact and firing the compact. The hot press method includes firing a powder mixture placed in a mold for sintering.

Examples of preferred wet methods include a filtration molding method (see Japanese Patent Application Laid-Open (kokai) No. 11-286002). The filtration molding method employs a filtration mold, formed of a water-insoluble material, for removing water under reduced pressure from a ceramic raw material slurry, to thereby yield a compact, the filtration mold comprising a lower mold having one or more water-discharge holes; a water-passing filter for placement on the lower mold; a seal material for sealing the filter; and a mold frame for securing the filter from the upper side through intervention of the seal material. The lower mold, mold frame, seal material, and filter, which can be separated from one another, are assembled to thereby form the filtration mold. According to the filtration molding method, water is removed under reduced pressure from the slurry only from the filter side. In a specific operation making use of the filtration mold, a powder mixture, ion-exchange water, and an organic additive are mixed, to thereby prepare a slurry, and the slurry is poured into the filtration mold. Water contained in the slurry is removed under reduced pressure from only the filter side, a compact is yielded. The resultant ceramic compact is dried, debindered, and fired.

The temperature at which the compact produced through the cold press method or the wet method is preferably 1,300 to 1,650° C., more preferably 1,500 to 1,650° C. The firing atmosphere is air, oxygen, a non-oxidizing atmosphere, vacuum, etc. In the case where hot-press method is employed, the compact is preferably sintered at about 1,200° C., and the atmosphere is a non-oxidizing atmosphere, vacuum, etc. In each method, after firing, the fired compact is mechanically worked so as to form a target having predetermined dimensions.

EXAMPLES

The present invention will next be described by way of examples, which should not be construed as limiting the invention thereto.

Sputtering Target Production Example 1

A >99.99%-purity $In_2O_3$ powder, an $SnO_2$ powder, and a >99.9%-purity $BaCO_3$ powder were provided.

Firstly, $In_2O_3$ powder (BET=27 m²/g) (58.5 wt. %) and $BaCO_3$ powder (BET=1.3 m²/g) (41.4 wt. %) (total: 200 g) were mixed by means of a ball mill in a dry state, and the mixture was calcined in air at 1,100° C. for three hours, to thereby form $BaIn_2O_4$ powder.

The $BaIn_2O_4$ powder (5.5 wt. %), $In_2O_3$ powder (BET=15 m²/g) (84.7 wt. %), and $SnO_2$ powder (BET=1.5 m²/g) (9.8 wt. %) (total: about 1.0 kg) were provided (Ba: about 0.02 mol, Sn: about 0.10 mol, based on 1 mol of In), and the mixture was mixed by means of a ball mill. Subsequently, the powder was mixed with an aqueous PVA solution serving as a binder, dried, and cold-pressed, to thereby prepare a compact. The compact was debindered in air at 600° C. for 10 hours at 60° C./h, and fired in an oxygen atmosphere at 1,600° C. for eight hours, to thereby form a sintered compact. In the firing, the temperature was elevated from room temperature to 800° C. at 100° C./h and from 800° C. to 1,600° C. at 400° C./h, was maintained at 1,600° C. for eight hours, and was lowered from 1,600° C. to room temperature at 100° C./h. The sintered compact was worked, to thereby produce a target having a density of 6.20 g/cm³ and exhibiting a bulk resistivity of $3.18\times10^{-3}$ Ωcm.

Sputtering Target Production Example 2

The procedure of Production Example 1 was repeated, except that $BaIn_2O_4$ powder (2.5 wt.%), $In_2O_3$ powder (BET=15 m²/g) (83.6 wt. %), and $SnO_2$ powder (BET=1.5 m²/g) (13.9 wt. %) (Ba: about 0.01 mol, Sn: about 0.15 mol, based on 1 mol of In) were used, to thereby produce a target. A film was deposited from the target. The produced target was found to have a density of 6.74 g/cm³ and exhibit a bulk resistivity of $2.92\times10^{-3}$ Ωcm.

Sputtering Target Production
Comparative Example 1

The procedure of Production Example 1 was repeated, except that $BaIn_2O_4$ powder (25.4 wt. %), $In_2O_3$ powder (BET=4.7 m²/g) (65.5 wt. %), and $SnO_2$ powder (BET=1.5 m²/g) (9.1 wt. %) (Ba: about 0.10 mol, Sn: about 0.10 mol, based on 1 mol of In) were used, to thereby produce a target. A film was deposited from the target. The produced target was found to have a density of 6.81 g/cm³ and exhibit a bulk resistivity of $5.62\times10^{-4}$ Ωcm.

Sputtering Target Production
Comparative Example 2

SnO$_2$ powder (BET=1.5 m$^2$/g) (0.07 wt. %), ZnO powder (purity: 99.5%, BET=3.5 m$^2$/g) (10.7 wt. %), and In$_2$O$_3$ powder (BET=4.7 m$^2$/g) (89.2 wt. %) (total: about 1.0 kg) were provided (Sn: 0.03 mol, Zn: 0.82 mol, based on 1 mol of In). According to the procedure as disclosed in the specification of Japanese Patent No. 3721080, the powders were mixed, dried, and press-molded, to thereby form a compact. The compact was sintered, to thereby form a sintered target. The target was found to have a relative density (with respect to theoretical density of 6.97 g/cm$^3$) of 98.3% and exhibit a bulk resistivity of 3.4×10$^{-3}$ Ωcm.

Examples 1 and 2 and
Comparative Examples 1 and 2

Each of the sputtering target produced in the Production Examples was placed in a 4-inch DC magnetron sputtering apparatus. A barium-containing indium oxide-based film (ITO-BaO) or an IZO film was deposited from the corresponding target at a substrate temperature of 100° C. with variation of oxygen partial pressure from 0 to 2.0 sccm by 0.5 sccm (corresponding to 0 to 6.46×10$^{-5}$ Torr). Thus, transparent conductive films of Examples 1 and 2 and Comparative Examples 1 and 2 were produced.

Each target was subjected to sputtering under the following conditions, whereby an oxide film having a thickness of 1,200 Å was deposited.

Sputtering Conditions:
Target dimensions: φ=4 inches, t=6 mm
Mode of sputtering: DC magnetron sputtering
Evacuation apparatus: Rotary pump+cryo-pump
Ultimate vacuum: 4.0×10$^8$ [Torr] (5.3×10$^{-6}$ [Pa])
Ar pressure: 3.0×10$^{-3}$ [Torr] (4.0×10$^{-1}$ [Pa])
Oxygen pressure: 0 to 6.6×10$^{-5}$ [Torr] (0 to 1.1×10$^{-2}$ [Pa])
Substrate temperature: 100° C.
Electric power for sputtering: 130 W (power density: 1.6 W/cm$^2$)
Substrate used: Corning #1737 (glass sheet for liquid crystal display, t=0.8 mm)

FIG. 1 shows the relationship between oxygen partial pressure (Torr) and specific resistance ρ (Ωcm) of the deposited transparent conductive films.

In any of the Examples and Comparative Example, presence of the optimum oxygen partial pressure was confirmed. The resistivity attained through film deposition at the optimum oxygen partial pressure in Example 1 or 2 was found to be almost equivalent to that of IZO produced in Comparative Example 2. However, in Comparative Example 1, when the amount of added barium increased, the resistivity of the film deposited at the optimum oxygen partial pressure was found to increase.

Test Example 1

Each of the transparent conductive films deposited at 100° C. and at an optimum oxygen partial pressure in Examples 1 and 2 and Comparative Examples 1 and 2 was cut into a piece (13 mm×13 mm), and the sample was annealed in air at 300° C. for one hour. FIGS. 2 to 5 show thin-film XRD patterns of the samples before and after annealing.

As shown in FIGS. 2 to 5, thin-film XRD patterns (before annealing) of the films in Examples 1 and 2 confirm that the as-deposited films were amorphous. Through annealing at 300° C. for one hour, the films were crystallized. In Comparative Example 1 and Comparative Example 2 (IZO), both the as-deposited film and the annealed film were found to be amorphous.

Test Example 2

Resistivity ρ (Ωcm) of the transparent conductive films deposited at 100° C. and at an optimum oxygen partial pressure was determined. Resistivity of the samples of Test Example 1 which had undergone annealing was also determined. The results are shown in Table 1.

As is clear from Table 1, the samples of Examples 1 and 2 exhibits the optimum oxygen partial pressure almost equivalent to that of IZO and a resistivity value of several 10$^{-4}$, but the sample of Comparative Example 1 exhibits considerably high resistivity.

The resistivity of the samples of Examples 1 and 2 was not virtually varied after annealing at 300° C. for one hour and rather decreased slightly. The samples of Comparative Examples 1 and 2 (IZO) exhibited an increase in resistivity after annealing, indicating the samples have unsatisfactory heat resistance.

Test Example 3

Each of the transparent conductive films deposited at 100° C. and at an optimum oxygen partial pressure in Examples 1 and 2 and Comparative Examples 1 and 2 was cut into a piece (13 mm×13 mm), and a transmission spectrum of the sample was measured. In a similar manner, a transmission spectrum of the film of Test Example 1 which had undergone annealing was also measured. The results are shown in FIGS. 6 to 9. The average transmittance values of the samples are shown in Table 1.

As shown in transmission spectra of FIGS. 6 to 9, the as-deposited film samples (before annealing) exhibit the almost same transmission characteristics as those of IZO produced in Comparative Example 2. However, the absorption edge was found to be blue-sifted through annealing at 300° C. for one hour, thereby providing a more suitable color of the samples. Since the sample of Comparative Example 1 was not crystallized through annealing, transparency of the sample was unchanged. However, the sample of Comparative Example 2 (IZO) exhibits impaired transparency and poor heat resistance, after annealing at 300° C. for one hour.

Test Example 4

Each of the transparent conductive films deposited at 100° C. and at an optimum oxygen partial pressure in Examples 1 and 2 and Comparative Examples 1 and 2 was cut into a piece mm), etchability of the sample was tested at 30° C. by use of an etchant (ITO-05N, oxalic acid-based, product of Kanto Chemical Co., Inc.) (oxalic acid concentration: 50 g/L). The sample of Test Example 1 which had undergone annealing was also tested in a similar manner. The results are shown in Table 1, with the ratings "O" (etachable) and "X" (unetchable).

As is clear from Table 1, the amorphous samples of Examples 1 and 2 can be etched with a weakly acidic etchant, but cannot be etched after crystallization through annealing. The samples of Comparative Examples 1 and 2 (IZO), which are amorphous films before and after annealing, can be etched.

TABLE 1

| | | Composition (atomic ratio) | | | | After film deposition (before annealing) | | | After 300° C. annealing | | |
|---|---|---|---|---|---|---|---|---|---|---|---|
| | Samples | In | Sn | Ba | Zn | Specific resistance [Ω·cm] | Av. transmittance [%] | Etching | Specific resistance [Ω·cm] | Av. transmittance [%] | Etching |
| Ex. 1 | ITO-BaO | 1.00 | 0.10 | 0.02 | — | $5.76 \times 10^{-4}$ | 89.0 | ○ | $4.52 \times 10^{-4}$ | 90.5 | X |
| Ex. 2 | ITO-BaO | 1.00 | 0.15 | 0.01 | — | $5.04 \times 10^{-4}$ | 89.0 | ○ | $4.25 \times 10^{-4}$ | 90.5 | X |
| Comp. Ex. 1 | ITO-BaO | 1.00 | 0.10 | 0.10 | — | $1.61 \times 10^{-3}$ | 86.7 | ○ | $6.56 \times 10^{-2}$ | 80.0 | ○ |
| Comp. Ex. 2 | IZO | 1.00 | 0.03 | — | 0.82 | $3.61 \times 10^{-4}$ | 93.4 | ○ | $1.46 \times 10^{-3}$ | 82.5 | ○ |

Sputtering Target Production Examples A1 to A60

A >99.99%-purity $In_2O_3$ powder, an $SnO_2$ powder, and a >99.9%-purity $BaCO_3$ powder were provided.

Firstly, $In_2O_3$ powder (BET=27 m²/g) (58.5 wt. %) and $BaCO_3$ powder (BET=1.3 m²/g) (41.4 wt. %) (total: 200 g) were mixed by means of a ball mill in a dry state, and the mixture was calcined in air at 1,100° C. for three hours, to thereby form $BaIn_2O_4$ powder.

The $BaIn_2O_4$ powder, $In_2O_3$ powder (BET=5 m²/g), and $SnO_2$ powder (BET=1.5 m²/g) (total: about 1.0 kg) were provided so that the amounts of Ba and Sn based on 1 mol of In were adjusted to the values shown in Table 2 or 3, and each of the provided mixtures was mixed by means of a ball mill. Subsequently, the powder was mixed with an aqueous PVA solution serving as a binder, dried, and cold-pressed, to thereby prepare a compact. The compact was debindered in air at 600° C. for 10 hours at 60° C./h, and fired in an oxygen atmosphere at 1,600° C. for eight hours, to thereby form a sintered compact. In the firing, the temperature was elevated from room temperature to 800° C. at 100° C./h and from 800° C. to 1,600° C. at 400° C./h, was maintained at 1,600° C. for eight hours, and was lowered from 1,600° C. to room temperature at 100° C./h. The sintered compact was worked, to thereby produce a target. Among the thus-produced targets, for example, a target of composition A32 had a density of 6.88 g/cm³ and exhibited a bulk resistivity of $2.81 \times 10^{-4}$ Ωcm, and a target of composition A22 had a density of 6.96 g/cm³ and exhibited a bulk resistivity of $2.87 \times 10^{-4}$ Ωcm.

Test Examples A1 to A60

Each of the sputtering target produced in the Production Examples A1 to A60 was placed in a 4-inch DC magnetron sputtering apparatus. Transparent conductive films of Test Examples A1 to A60 were deposited from the target at a substrate temperature of about 20° C. (room temperature) with variation of oxygen partial pressure from 0 to 3.0 sccm (corresponding to 0 to $1.1 \times^{-2}$ Pa).

Each target was subjected to sputtering under the following conditions, whereby an oxide film having a thickness of 1,200 Å was deposited.

Sputtering Conditions:
Target dimensions: φ=4 inches, t=6 mm
Mode of sputtering: DC magnetron sputtering
Evacuation apparatus: Rotary pump+cryo-pump
Ultimate vacuum: $5.3 \times 10^{-6}$ [Pa]
Ar pressure: $4.0 \times 10^{-1}$ [Pa]
Oxygen pressure: 0 to $1.1 \times 10^{-2}$ [Pa]
Substrate temperature: room temperature
Electric power for sputtering: 130 W (power density: 1.6 W/cm²)
Substrate used: Corning #1737 (glass sheet for liquid crystal display, t=0.8 mm)

In each of Test Examples A1 to A60, the relationship between oxygen partial pressure during film deposition at room temperature and resistivity of the deposited film was investigated. Furthermore, etching rate of the deposited amorphous film, the relationship between resistivity of the annealed (at 250° C.) film and oxygen partial pressure during film deposition, and average transmittance of the annealed film were investigated.

Tables 2 and 3 given hereinbelow show the ratio by mole of Ba or Sn to In of each sample, the crystal state (a: amorphous, c: crystallized) after film deposition at room temperature, and crystallization temperature of the amorphous film.

In Tables 2 and 3, "resistivity at film deposition" refers to resistivity of a film deposited at room temperature and an optimum oxygen partial pressure (Test Example 5). "Etching rate" refers to an etching rate of an amorphous film deposited at room temperature by use of an etchant (ITO-05N, oxalic acid concentration: 50 g/L, 30° C.) (Test Example 6). "Resistivity after annealing" refers to resistivity of a film which has been deposited at an oxygen partial pressure so as to attain the lowest resistivity after annealing at 250° C. and which has been annealed at 250° C. (Test Example 5). "Average transmittance after annealing" refers to an average transmittance (wavelength: 400 to 500 nm) of a film which has been deposited at an oxygen partial pressure so as to attain the lowest resistivity after annealing at 250° C. and which has been annealed at 250° C.

Figure 10:
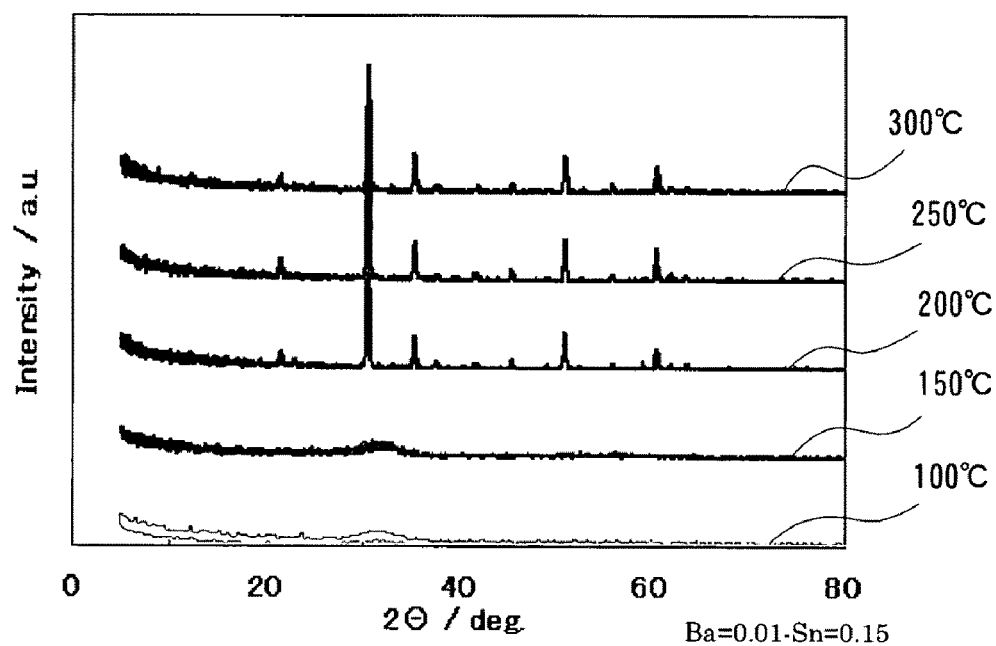
[FIG. 10] A chart showing thin-film XRD patterns of a composition of Test Example A32 measured at respective temperatures.

Crystallization temperature shown in Tables 2 and 3 was determined through the following procedure. Specifically, a film which had been deposited at room temperature and an oxygen partial pressure so as to attain the lowest resistivity after annealing at 250° C. was annealed in air for one hour at 100° C. to 300° C. (to 450° C. if required) in increments of 50° C., and the thus-annealed film was analyzed through thin-film XRD. As the annealing temperature increased, a diffraction line corresponding to a halo peak attributed to an amorphous film deposited at room temperature was detected. The temperature at which the diffraction line was first observed was defined as crystallization temperature. FIG. 10 shows thin-film XRD patterns of a composition of Test Example A32 measured at respective temperatures. FIG. 10 shows thin film XRD patterns at 100° C., 150° C., 200° C., 250° C., and 300° C. (bottom to top). In this case, the crystallization temperature is determined to be 200° C. Alternatively, the crystallization temperature and other parameters may be determined through the high-temperature thin-film XRD method.

TABLE 2

| Sample No. | Sn ratio | Ba ratio | Crystal state | Crystallization temp. | Resistivity of deposited film ($\times 10^{-4}$ Ωcm) | Etching rate (Å/sec) | Resistivity of annealed film ($\times 10^{-4}$ Ωcm) | Av. tranmittance of annealed film (%) |
|---|---|---|---|---|---|---|---|---|
| A1  | 0     | 0.1    | a | >450° C. | 19.0 | 22.3 | 21.4 | 79.3 |
| A2  | 0.025 | 0.07   | a | 400° C.  | 12.5 | 18.2 | 14.3 | 84.2 |
| A3  | 0.025 | 0.1    | a | >450° C. | 15.2 | 19.8 | 17.5 | 82.8 |
| A4  | 0.05  | 0.002  | c | <100° C. | 4.1  | X    | 3.0  | 94.3 |
| A5  | 0.05  | 0.005  | c | <100° C. | 4.1  | X    | 3.1  | 90.0 |
| A6  | 0.05  | 0.01   | c | <100° C. | 4.2  | X    | 3.4  | 88.6 |
| A7  | 0.05  | 0.02   | a | 150° C.  | 5.0  | 7.4  | 4.9  | 90.9 |
| A8  | 0.05  | 0.03   | a | 200° C.  | 7.5  | 10   | 6.2  | 91.2 |
| A9  | 0.05  | 0.05   | a | 400° C.  | 8.2  | 13.2 | 9.2  | 91.5 |
| A10 | 0.075 | 0.002  | c | <100° C. | 3.3  | X    | 2.1  | 92.4 |
| A11 | 0.075 | 0.005  | c | <100° C. | 3.3  | X    | 2.1  | 92.5 |
| A12 | 0.075 | 0.01   | a | 100° C.  | 4.2  | 6.7  | 3.1  | 90.0 |
| A13 | 0.075 | 0.02   | a | 150° C.  | 5.1  | 7.5  | 3.5  | 95.5 |
| A14 | 0.075 | 0.03   | a | 250° C.  | 6.7  | 8    | 5.1  | 91.8 |
| A15 | 0.1   | 0.0001 | c | <100° C. | 4.3  | X    | 1.8  | 95.2 |
| A16 | 0.1   | 0.0002 | c | <100° C. | 4.3  | X    | 1.8  | 95.2 |
| A17 | 0.1   | 0.0005 | c | <100° C. | 4.3  | X    | 1.8  | 95.3 |
| A18 | 0.1   | 0.001  | c | <100° C. | 4.3  | X    | 1.8  | 95.2 |
| A19 | 0.1   | 0.002  | c | <100° C. | 4.3  | X    | 1.8  | 94.8 |
| A20 | 0.1   | 0.005  | a | 100° C.  | 4.3  | 4.9  | 1.8  | 94.0 |
| A21 | 0.1   | 0.01   | a | 150° C.  | 4.7  | 5.4  | 2.3  | 92.2 |
| A22 | 0.1   | 0.02   | a | 200° C.  | 5.5  | 6.2  | 2.7  | 93.8 |
| A23 | 0.1   | 0.03   | a | 250° C.  | 6.1  | 6.7  | 4.6  | 92.5 |
| A24 | 0.1   | 0.05   | a | 400° C.  | 8.6  | 8    | 10.0 | 86.7 |
| A25 | 0.1   | 0.1    | a | >450° C. | 14.2 | 10.6 | 15.3 | 83.2 |
| A26 | 0.15  | 0.0001 | c | <100° C. | 4.6  | X    | 1.8  | 94.5 |
| A27 | 0.15  | 0.0002 | c | <100° C. | 4.6  | X    | 1.8  | 94.5 |
| A28 | 0.15  | 0.0005 | c | <100° C. | 4.6  | X    | 1.8  | 94.6 |
| A29 | 0.15  | 0.001  | a | 150° C.  | 4.6  | 3.9  | 1.8  | 94.5 |
| A30 | 0.15  | 0.002  | a | 150° C.  | 4.6  | 3.9  | 1.8  | 92.3 |

TABLE 3

| Sample No. | Sn ratio | Ba ratio | Crystal state | Crystallization temp. | Resistivity of deposited film ($\times 10^{-4}$ Ωcm) | Etching rate (Å/sec) | Resistivity of annealed film ($\times 10^{-4}$ Ωcm) | Av. tranmittance of annealed film (%) |
|---|---|---|---|---|---|---|---|---|
| A31 | 0.15 | 0.005   | a | 150° C.  | 4.6  | 4   | 1.8  | 92.1 |
| A32 | 0.15 | 0.01    | a | 200° C.  | 5.0  | 4.1 | 2.1  | 93.2 |
| A33 | 0.15 | 0.02    | a | 250° C.  | 6.0  | 4.4 | 2.6  | 91.4 |
| A34 | 0.15 | 0.03    | a | 350° C.  | 6.9  | 4.7 | 5.9  | 91.5 |
| A35 | 0.15 | 0.05    | a | >450° C. | 8.6  | 4.9 | 8.1  | 84.7 |
| A36 | 0.2  | 0.00006 | c | <100° C. | 4.8  | X   | 1.9  | 94.5 |
| A37 | 0.2  | 0.0001  | a | 150° C.  | 4.8  | 3.5 | 1.9  | 93.4 |
| A38 | 0.2  | 0.0002  | a | 150° C.  | 4.8  | 3.5 | 1.9  | 93.2 |
| A39 | 0.2  | 0.0005  | a | 150° C.  | 4.8  | 3.5 | 1.9  | 93.8 |
| A40 | 0.2  | 0.001   | a | 200° C.  | 4.8  | 3.5 | 1.9  | 94.4 |
| A41 | 0.2  | 0.002   | a | 200° C.  | 4.8  | 3.5 | 1.9  | 93.6 |
| A42 | 0.2  | 0.005   | a | 200° C.  | 5.2  | 3.6 | 1.9  | 93.4 |
| A43 | 0.2  | 0.01    | a | 200° C.  | 5.8  | 4   | 2.4  | 93.5 |
| A44 | 0.2  | 0.02    | a | 250° C.  | 6.7  | 4.2 | 3.0  | 93.0 |
| A45 | 0.2  | 0.03    | a | 400° C.  | 8.0  | 4.5 | 6.2  | 92.0 |
| A46 | 0.2  | 0.05    | a | >450° C. | 10.1 | 4.7 | 9.8  | 83.5 |
| A47 | 0.22 | 0.00005 | a | 100° C.  | 4.9  | 3   | 2.0  | 94.3 |
| A48 | 0.22 | 0.033   | a | 400° C.  | 8.1  | 4.6 | 6.3  | 89.6 |
| A49 | 0.25 | 0.0001  | a | 250° C.  | 4.7  | 2.3 | 2.1  | 95.0 |
| A50 | 0.25 | 0.0002  | a | 250° C.  | 4.7  | 2.3 | 2.1  | 93.9 |
| A51 | 0.25 | 0.0005  | a | 250° C.  | 4.7  | 2.3 | 2.1  | 94.9 |
| A52 | 0.25 | 0.001   | a | 250° C.  | 4.7  | 2.3 | 3.6  | 93.2 |
| A53 | 0.3  | 0.0001  | a | 300° C.  | 5.3  | 1.2 | 4.3  | 89.0 |
| A54 | 0.3  | 0.0002  | a | 300° C.  | 5.3  | 1.2 | 4.3  | 89.0 |
| A55 | 0.3  | 0.0005  | a | 300° C.  | 5.3  | 1.2 | 4.3  | 89.0 |
| A56 | 0.3  | 0.001   | a | 300° C.  | 5.3  | 1.2 | 4.3  | 88.9 |
| A57 | 0.3  | 0.002   | a | 300° C.  | 5.4  | 1.2 | 4.4  | 87.8 |
| A58 | 0.3  | 0.005   | a | 350° C.  | 5.7  | 1.3 | 4.7  | 88.9 |
| A59 | 0.3  | 0.01    | a | 400° C.  | 6.2  | 1.7 | 5.1  | 95.7 |
| A60 | 0.3  | 0.02    | a | 450° C.  | 7.8  | 1.9 | 6.0  | 94.5 |

Test Example 5

Figure 11:
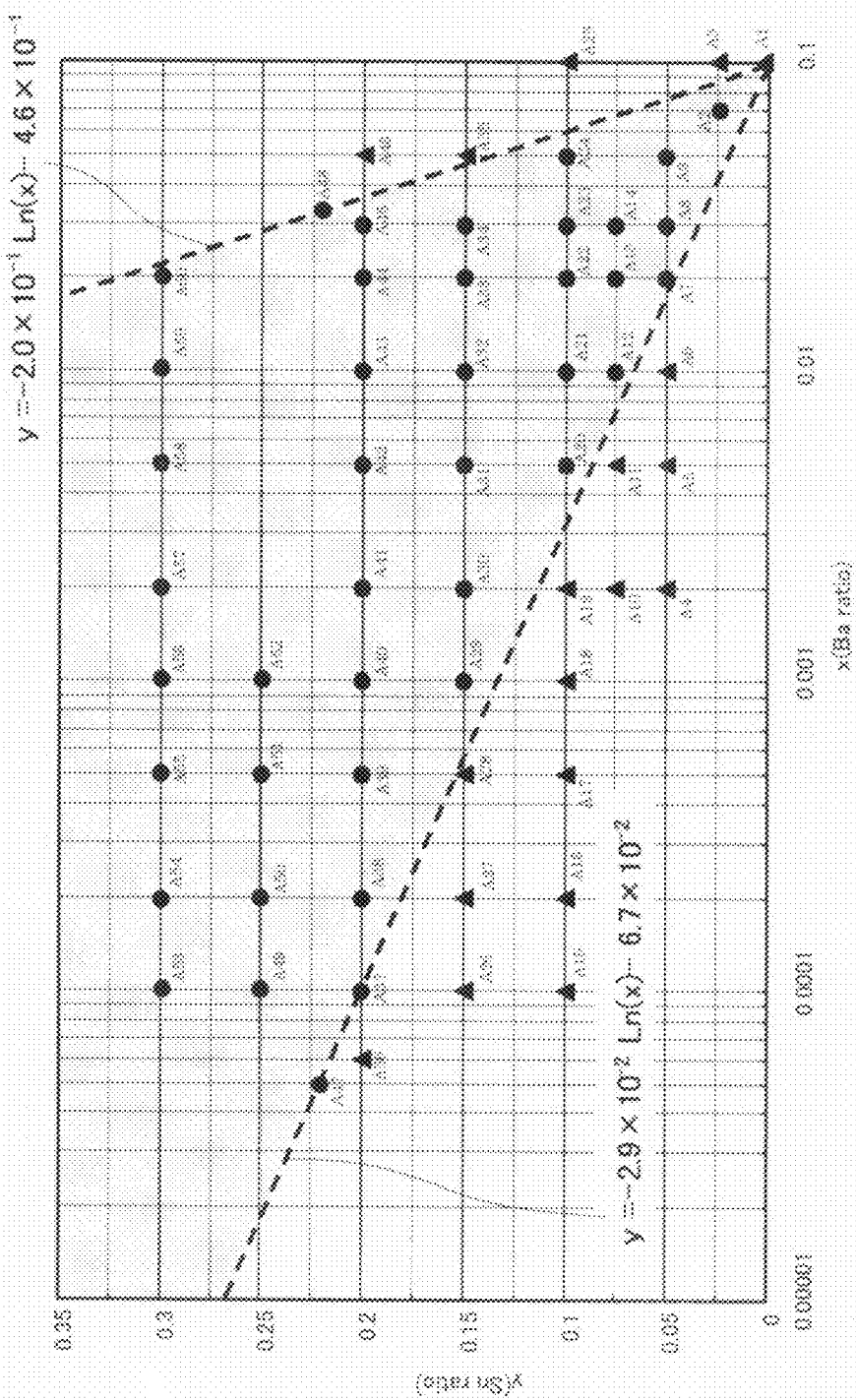
[FIG. 11] A graph showing the results of Test Example 5.
Figure 12:
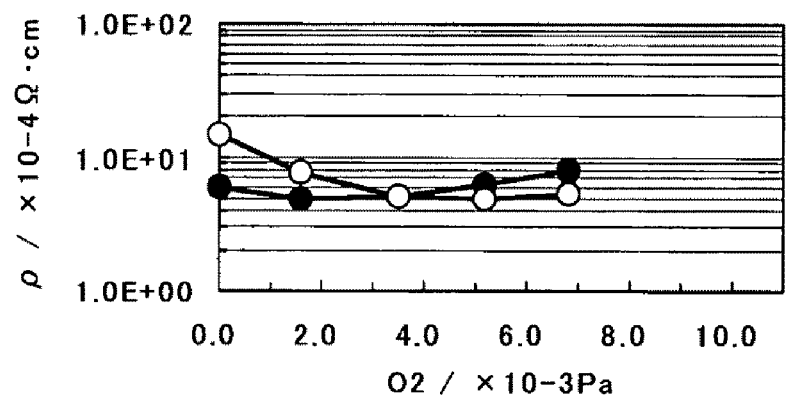
[FIG. 12] A graph showing the relationship between oxygen partial pressure and resistivity during film deposition at room temperature in Test Example A7.
Figure 13:
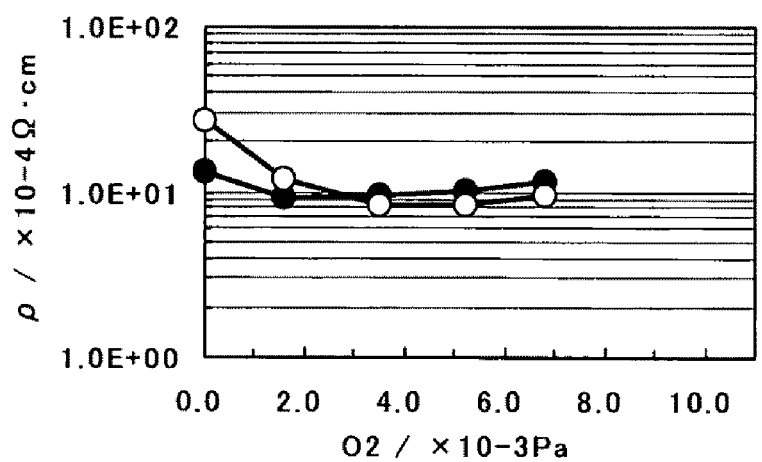
[FIG. 13] A graph showing the relationship between oxygen partial pressure and resistivity during film deposition at room temperature in Test Example A9.
Figure 14:
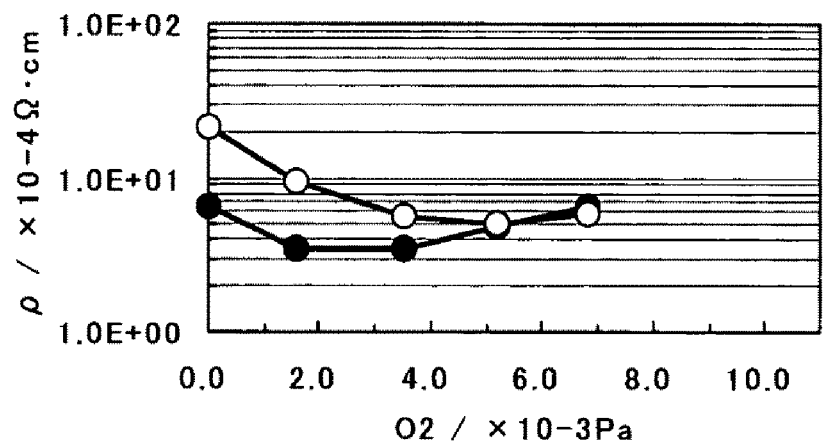
[FIG. 14] A graph showing the relationship between oxygen partial pressure and resistivity during film deposition at room temperature in Test Example A13.
Figure 15:
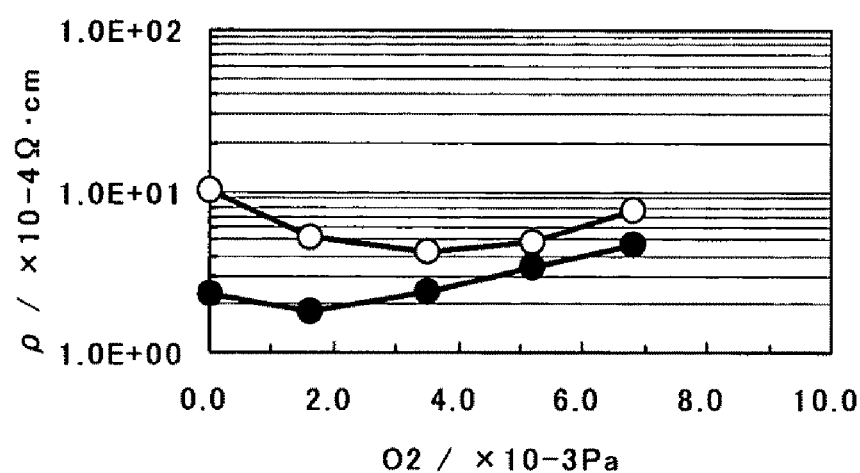
[FIG. 15] A graph showing the relationship between oxygen partial pressure and resistivity during film deposition at room temperature in Test Example A20.
Figure 16:
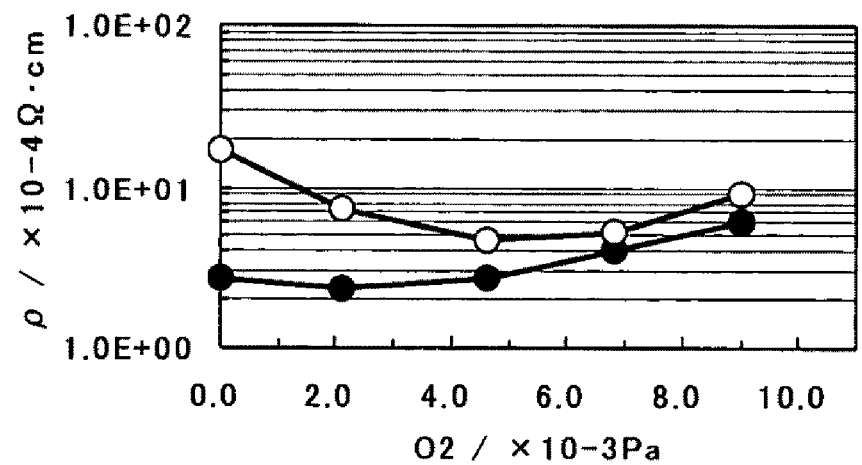
[FIG. 16] A graph showing the relationship between oxygen partial pressure and resistivity during film deposition at room temperature in Test Example A21.
Figure 17:
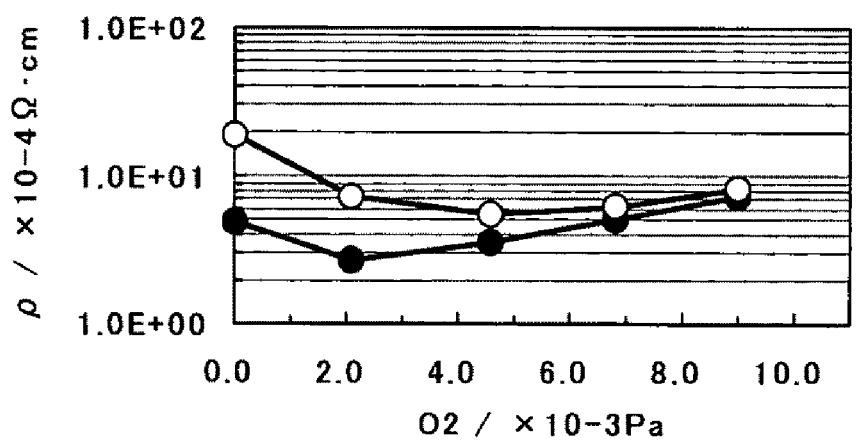
[FIG. 17] A graph showing the relationship between oxygen partial pressure and resistivity during film deposition at room temperature in Test Example A22.
Figure 18:
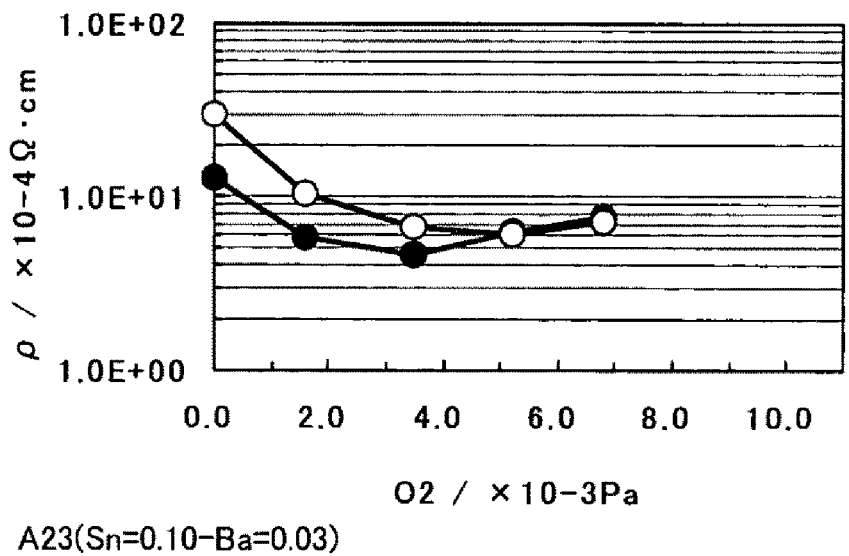
[FIG. 18] A graph showing the relationship between oxygen partial pressure and resistivity during film deposition at room temperature in Test Example A23.
Figure 19:
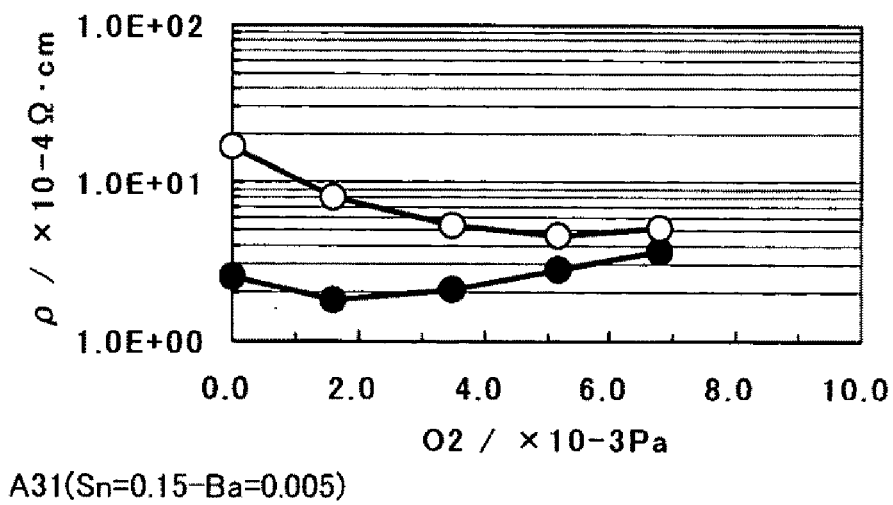
[FIG. 19] A graph showing the relationship between oxygen partial pressure and resistivity during film deposition at room temperature in Test Example A31.
Figure 20:
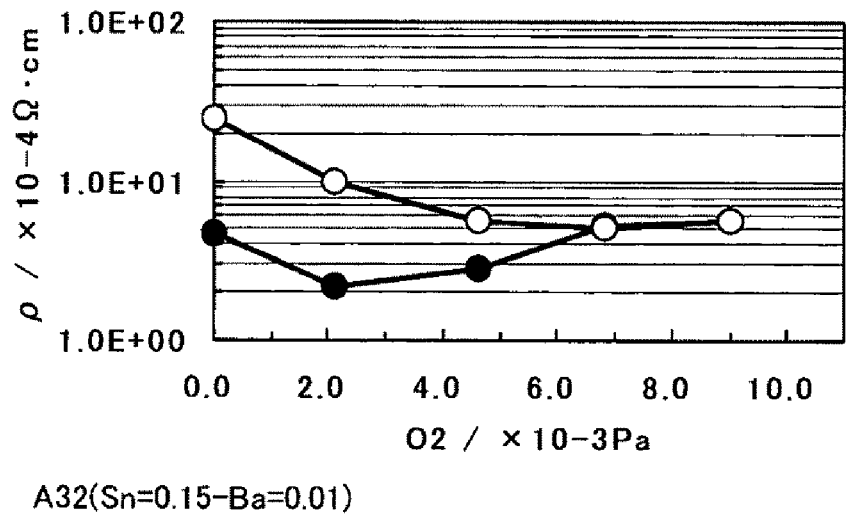
[FIG. 20] A graph showing the relationship between oxygen partial pressure and resistivity during film deposition at room temperature in Test Example A32.
Figure 21:
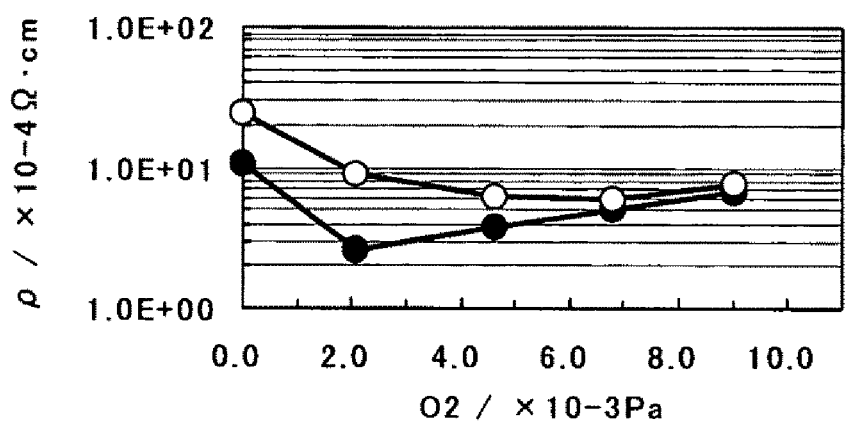
[FIG. 21] A graph showing the relationship between oxygen partial pressure and resistivity during film deposition at room temperature in Test Example A33.
Figure 22:
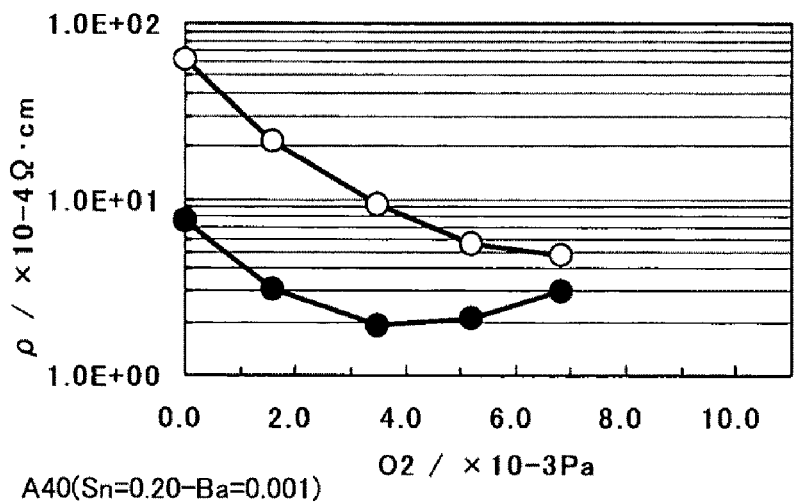
[FIG. 22] A graph showing the relationship between oxygen partial pressure and resistivity during film deposition at room temperature in Test Example A40.
Figure 23:
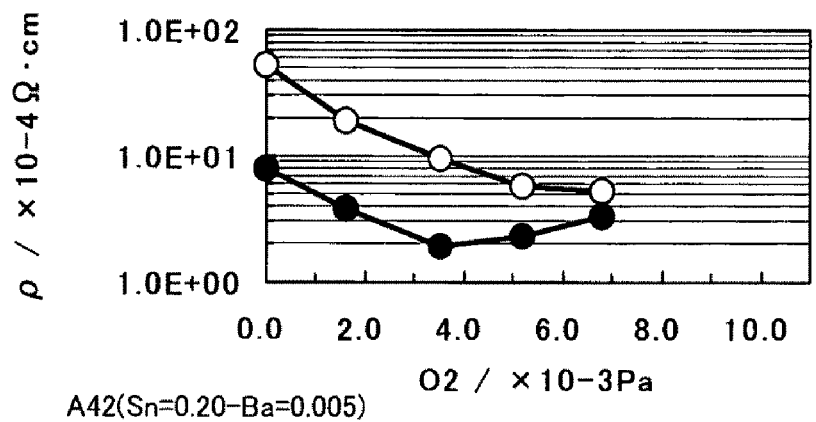
[FIG. 23] A graph showing the relationship between oxygen partial pressure and resistivity during film deposition at room temperature in Test Example A42.
Figure 24:
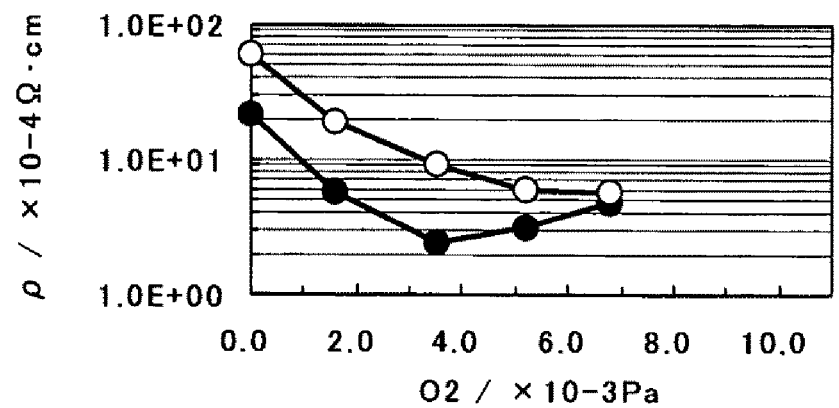
[FIG. 24] A graph showing the relationship between oxygen partial pressure and resistivity during film deposition at room temperature in Test Example A43.
Figure 25:
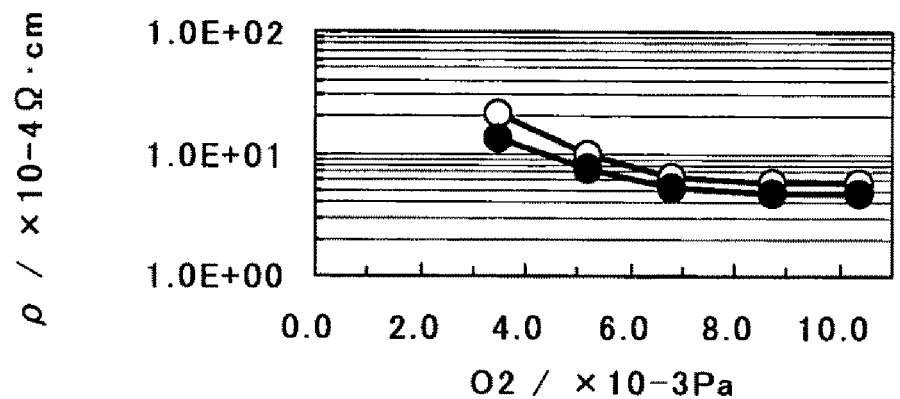
[FIG. 25] A graph showing the relationship between oxygen partial pressure and resistivity during film deposition at room temperature in Test Example A58.
Figure 26:
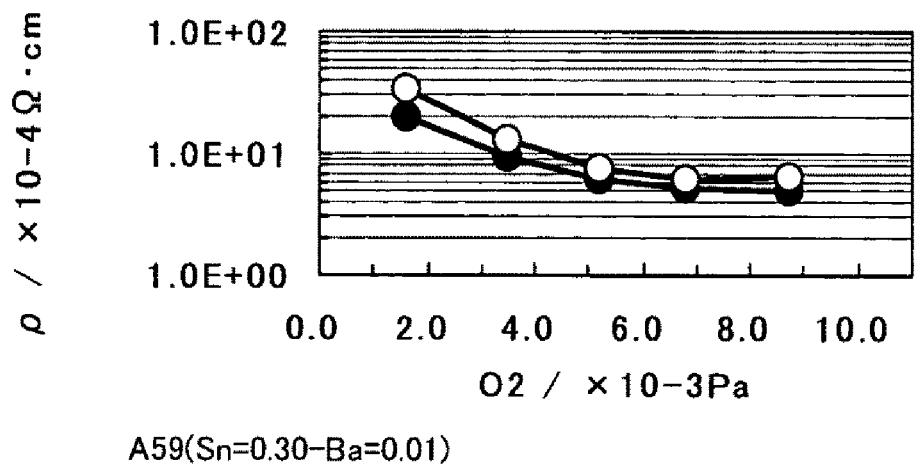
[FIG. 26] A graph showing the relationship between oxygen partial pressure and resistivity during film deposition at room temperature in Test Example A59.
Figure 27:
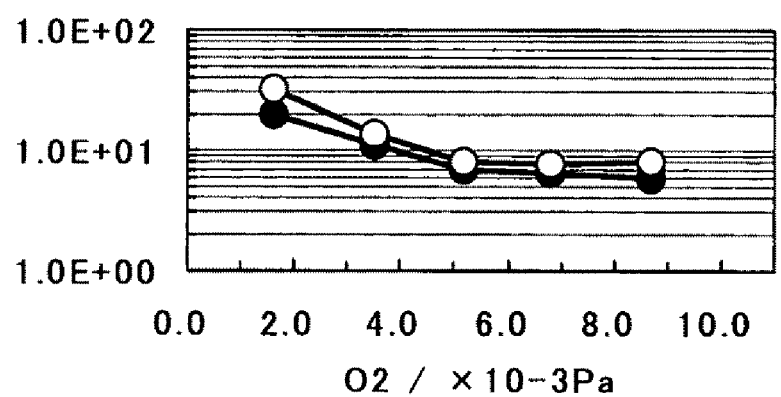
[FIG. 27] A graph showing the relationship between oxygen partial pressure and resistivity during film deposition at room temperature in Test Example A60.

The sputtering targets produced in Production Examples A1 to A60 were tested, whereby the relationship between oxygen partial pressure during deposition of a film at room temperature (about 20° C.) and resistivity of the deposited films was obtained. From the relationship, the optimum oxygen partial pressure values were obtained. Separately, from the relationship between resistivity of a film annealed at 250° C. at a given oxygen partial pressure and oxygen partial pressure during film deposition, an oxygen partial pressure for attaining the lowest resistivity of the film annealed at 250° C. was obtained. The thus-obtained oxygen partial pressure values were employed as optimum oxygen partial pressure values for film deposition at 250° C. The two types of optimum oxygen partial pressures were compared with each other. In FIG. 11, a sample exhibiting two different optimum partial pressure values is denoted by a black circle, whereas a sample exhibiting two optimum partial pressure values which are virtually identical with each other is denoted by a black triangle.

As shown in FIG. 11, when the ratio (y) by mole of tin to indium is $(-2.9\times10^{-2}\mathrm{Ln}(x)-6.7\times10^{-2})$ or more and $(-2.0\times10^{-1}\mathrm{Ln}(x)-4.6\times10^{-1})$ or less (wherein x represents a molar ratio of barium to indium, with the case of y=0 being excluded), a film-deposition oxygen partial pressure which provides a deposited amorphous film with the lowest resistivity differs from a film-deposition oxygen partial pressure which provides a crystallized film obtained after undergoing annealing with the lowest resistivity or from an optimum oxygen partial pressure at 250° C. differs from an optimum oxygen partial pressure at room temperature. In other words, when the ratio (y) falls within the above range, film deposition is preferably carried out at the oxygen partial pressure at which the film crystallized by annealing has the lowest resistivity, rather than at the optimum oxygen partial pressure obtained from the resistivity of the as-deposited amorphous film, in that the resistivity of the annealed film decreases.

In the above Test Example, samples A7, A9, A13, A20, A21, A22, A23, A31, A32, A33, A40, A42, A43, A58, A59, and A60 have a ratio (y) falling within the above range. FIGS. 12 to 27 each provide a graph showing the relationship between oxygen partial pressure during film deposition at room temperature and resistivity. In each graph, the white circle denotes the resistivity of as-deposited film, and the black circle denotes resistivity of the film annealed at 250° C. In most of the samples, the oxygen partial pressure at which the film annealed at 250° C. has a low resistivity is lower than the oxygen partial pressure at room temperature, indicating that film deposition is preferably carried out at low oxygen partial pressure. In the cases of Samples A58 to A60, the oxygen partial pressure at which the film annealed at 250° C. has a low resistivity is higher than the oxygen partial pressure at room temperature, indicating that film deposition is preferably carried out at high oxygen partial pressure in order to produce low-resistance transparent conductive film.

The samples including A2, A9, and A24, having a high crystallization temperature, are not crystallized through annealing at 250° C. Thus, the films annealed at 250° C. exhibit the lowest resistivity higher than that of the films deposited at room temperature and an optimum oxygen partial pressure. Resistivity of the films deposited at room temperature and an optimum oxygen partial pressure further increases through annealing at 250° C. Therefore, the lowest resistance can be attained by annealing the film deposited at room temperature and an optimum oxygen partial pressure at which the lowest resistance is attained at annealing temperature. In the case where these samples are annealed at a crystallization temperature (e.g., 400° C.), needless to say, film deposition is preferably performed at an oxygen partial pressure at which the lowest resistivity of the annealed film is attained. In this case, the barium mole ratio (x) is preferably lower than 0.05.

In Test Example 5, the oxygen partial pressure at which the film annealed at 250° C. exhibits low resistance is conceived to be almost equivalent to the optimum oxygen partial pressure during film deposition at 250° C.

Figure 28:
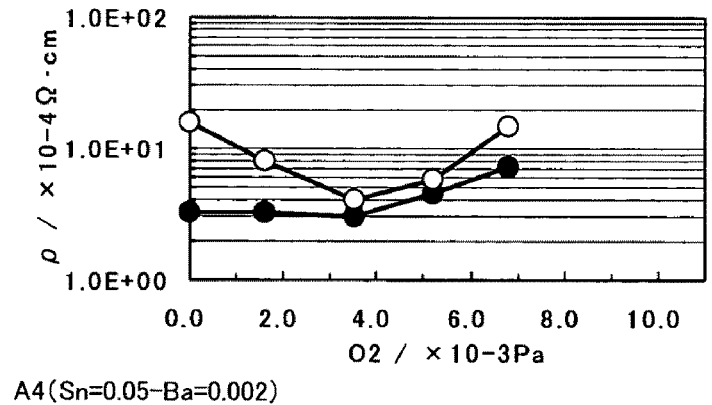
[FIG. 28] Graphs showing the relationship between oxygen partial pressure and resistivity during film deposition at room temperature in Test Examples A4, A6, and A35.
Figure 28:
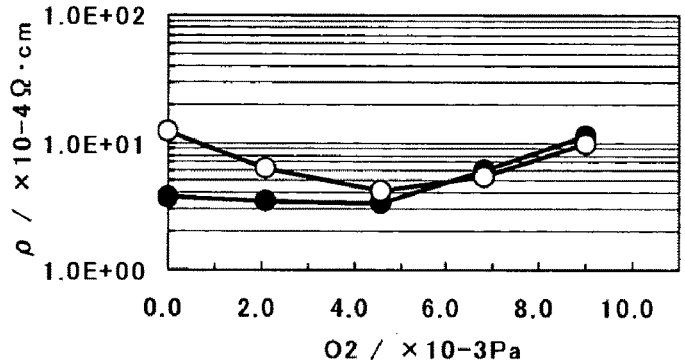
Figure 28:
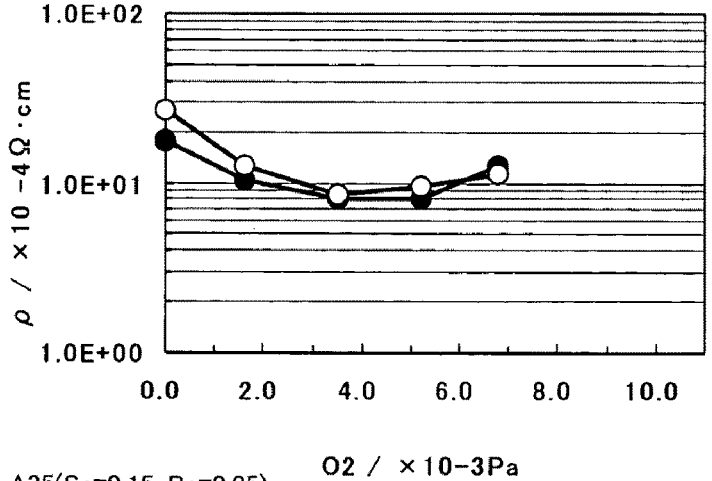

In some of the tested samples, the oxygen partial pressure at which the as-deposited film exhibits low resistance is equivalent to the oxygen partial pressure at which the film annealed at 250° C. exhibits low resistance. Samples A4, A6, and A35 are examples of the case graphs showing the feature are shown in FIG. 28. In these samples, the optimum partial pressure during film deposition at room temperature is conceived to be equivalent to that during deposition at 250° C.

Test Example 6

In a manner similar to that of Test Example 4, each of the transparent conductive films deposited at room temperature and at an optimum oxygen partial pressure was cut into a piece (10×50 mm), and etching rate of the sample was determined at 30° C. by use of an etchant (ITO-05N, oxalic acid-based, product of Kanto Chemical Co., Inc.) (oxalic acid concentration: 50 g/L). The results are shown in FIG. 29, with ratings denoted by "black triangle" (<3 Å/sec), "black circle" ($\geq 3$ and <4 Å/sec), and "white circle" ($\geq 4$ Å/sec).

Figure 29:
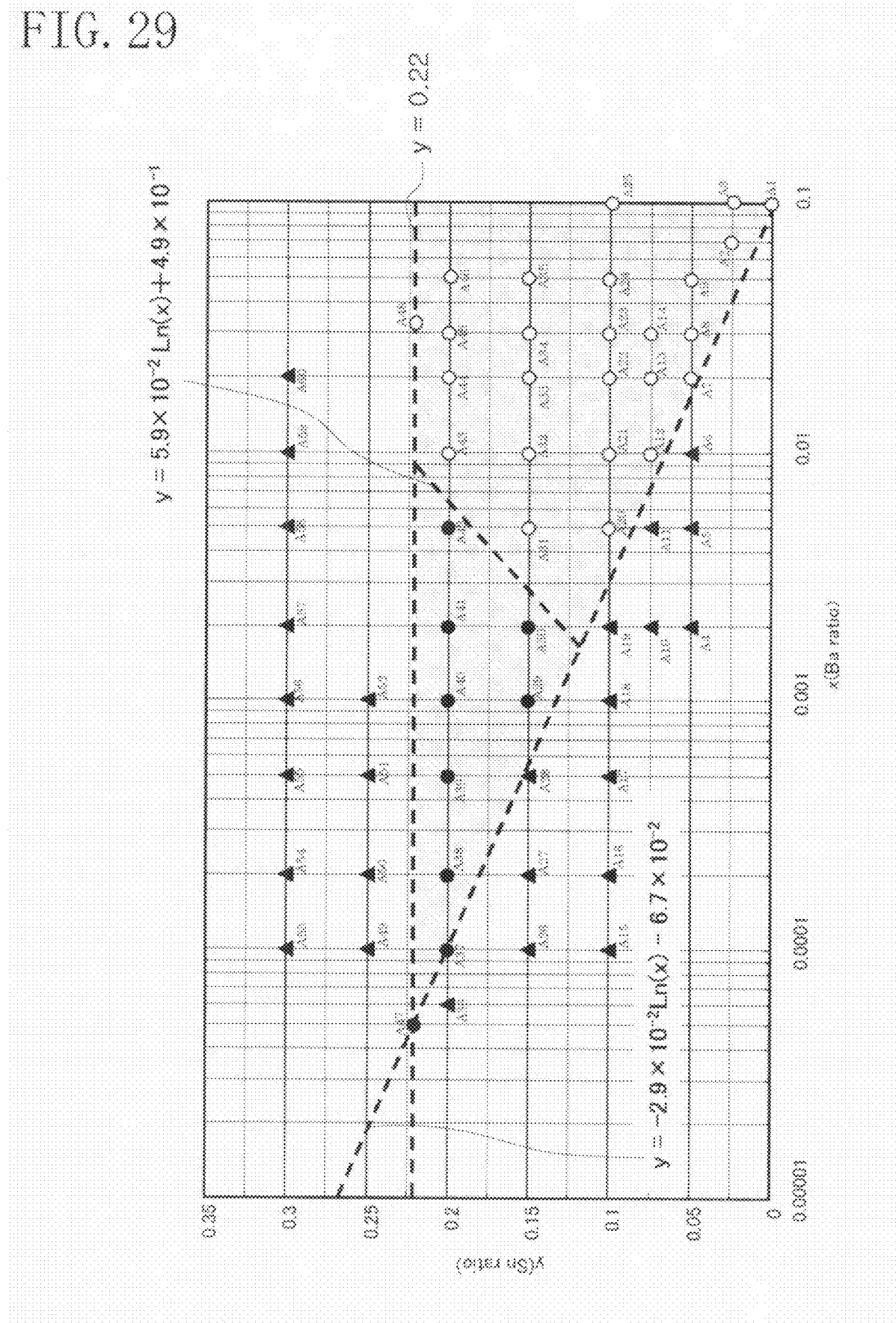
[FIG. 29] A graph showing the results of Test Example 6.

As shown in FIG. 29, when the ratio (y) by mole of tin to indium is $(-2.9\times10^{-2}\mathrm{Ln}(x)-6.7\times10^{-2})$ or more and is 0.22 or less (wherein x represents a molar ratio of barium to indium), the etching rate was found to be 3 Å/sec or more. Particularly when the ratio (y) by mole of tin to indium is $(5.9\times10^{-2}\mathrm{Ln}(x)+4.9\times10^{-1})$ or less, the etching rate was found to be 4 Å/sec or more.

Figure 30:
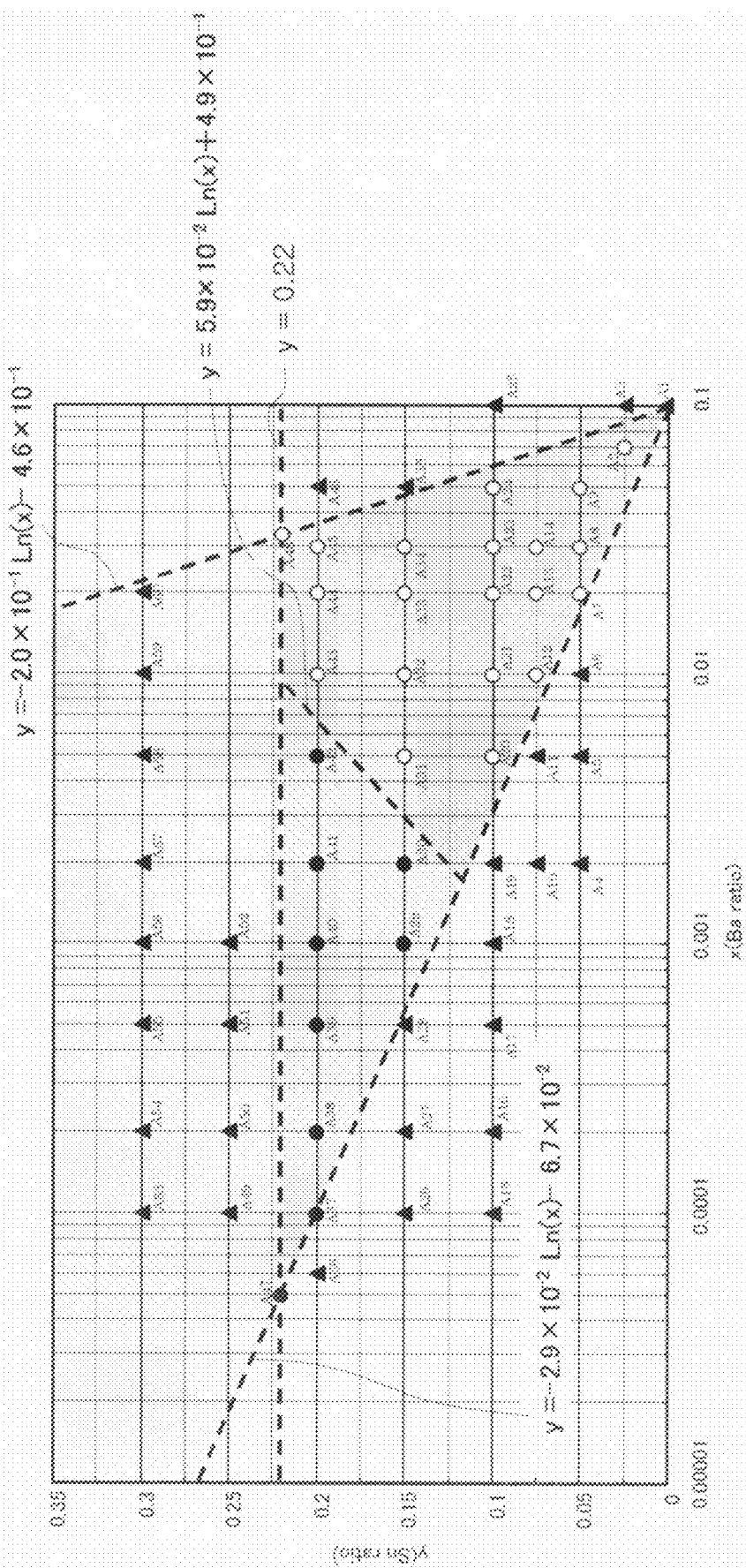
[FIG. 30] A graph showing the results of Test Examples 5 and 6.

The results together with the results of Test Example 5 are collectively shown in FIG. 30. As is clear from FIG. 30, when the ratio (y) by mole of tin to indium is $(-2.9\times10^{-2}\mathrm{Ln}(x)-6.7\times10^{-2})$ or more and $(-2.0\times10^{-1}\mathrm{Ln}(x)-4.6\times10^{-1})$ or less, and is 0.22 or less (wherein x represents a molar ratio of barium to indium, and the case of y=0 is excluded), the optimum oxygen partial pressure at room temperature differed from that at an annealing temperature (250° C.), and the etching rate was found to be 3 Å/sec or more. Particularly when the ratio (y) by mole of tin to indium is $(5.9\times10^{-2}\mathrm{Ln}(x)+4.9\times10^{-1})$ or less, the etching rate was found to be 4 Å/sec or more.

Test Example 7

Amorphous films were deposited from the samples of Test Examples having a ratio (y) falling within a preferred range shown in FIG. 30, at an oxygen partial pressure at which the annealed films exhibit low resistance. Each of the deposited amorphous films was crystallized through annealing, to thereby form a transparent conductive film, and resistivity thereof was determined. The results are shown in FIG. 31, with ratings "double circle" ($\leq 3.0\times10^{-4}$ Ωcm) and "white circle" (>$3.0\times10^{-4}$ Ωcm).

Figure 31:
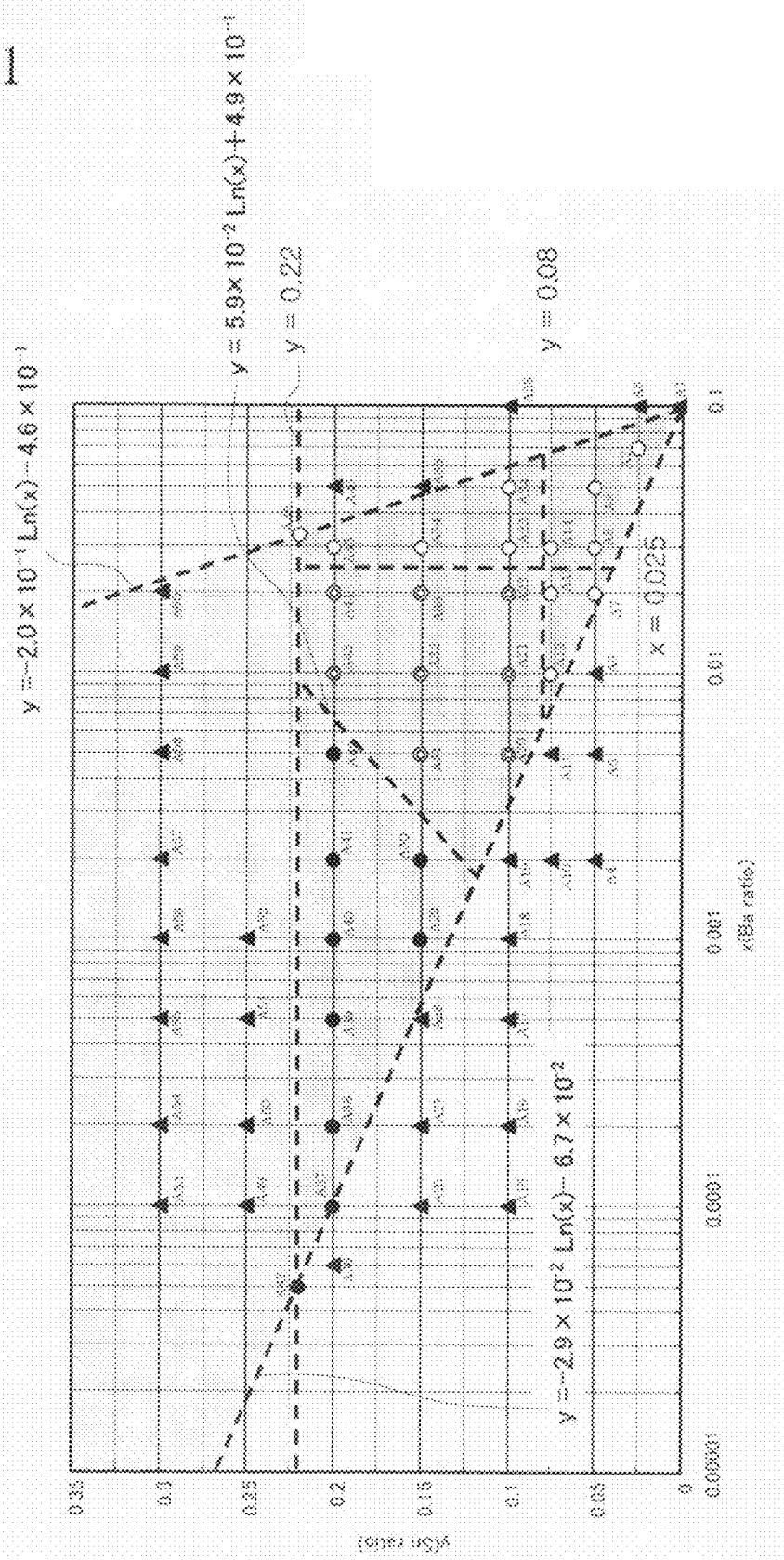
[FIG. 31] A graph showing the results of Test Example 7.

As is clear from FIG. 31, the samples having a molar ratio (y) of tin to indium of 0.08 or more, and a molar ratio (x) of barium to indium of 0.025 or less were found to exhibit a remarkably low resistivity ($\leq 3.0\times10^{-4}$ Ωcm). In consideration of the results of Test Examples 5 and 6, the film deposited at room temperature and an oxygen partial pressure optimum at an annealing temperature (e.g., 250° C.) and crystallized through annealing was found to exhibit a resistivity of $3.0\times10^{-4}$ Ωcm or less.

The invention claimed is:

1. A transparent conductive film deposited from a sputtering target comprising a sintered oxide including indium oxide, barium, and, optionally, tin, characterized in that the sintered oxide contains barium in an amount of 0.00001 mol or more and less than 0.10 mol, with respect to 1 mol of indium, and the film comprises indium oxide, barium, and, optionally, tin, and wherein the film has been deposited in an amorphous state.

2. A transparent conductive film as described in claim 1, which is deposited from a sputtering target containing tin in an amount of 0 to 0.3 mol, with respect to 1 mol of indium.

3. A transparent conductive film as described in claim 1, which exhibits a resistivity of $1.0\times10^{-4}$ to $1.0\times10^{-3}$ Ωcm.

4. A transparent conductive film as described in claim 1, which subsequent to being deposited, is crystallized through annealing.

5. A transparent conductive film as described in claim 4, which has been crystallized through annealing at 100 to 400° C.

6. A transparent conductive film as described in claim 4, which exhibits, after crystallization through annealing, an average transmittance at a wavelength of 400 to 500 nm of 85% or higher.

7. A transparent conductive film as described in claim 1, wherein the ratio (y) by mole of tin to indium is $(-2.9\times10^{-2} \mathrm{Ln}(x)-6.7\times10^{-2})$ or more and $(-2.0\times10^{-1}\mathrm{Ln}(x)\ 4.6\times10^{-1})$ or less, wherein x represents a molar ratio of barium to indium, with the case of y=0 being excluded.

8. A transparent conductive film as described in claim 1, wherein the ratio (y) by mole of tin to indium is $(-2.9\times10^{-2} \mathrm{Ln}(x)-6.7\times10^{-2})$ or more and $(-2.0\times10^{-1}\mathrm{Ln}(x)-4.6\times10^{-1})$ or less, and is 0.22 or less, wherein x represents a molar ratio of barium to indium, with the case of y=0 being excluded.

9. A transparent conductive film as described in claim 8, wherein the ratio (y) by mole of tin to indium is $(5.9\times10^{-2}\mathrm{Ln}(x)+4.9\times10^{-1})$ or less, wherein x represents a molar ratio of barium to indium.

10. A transparent conductive film of according to claim 9, wherein the ratio (y) by mole of tin to indium is 0.08 or more, and the ratio (x) by mole of barium to indium is 0.025 or less.

11. A method for producing a transparent conductive film which is amorphous and which contains indium oxide, barium, and, optionally, tin, characterized in that the method comprises depositing a film in an amorphous state from a sputtering target comprising a sintered oxide including indium oxide, barium in an amount of 0.00001 mol or more and less than 0.10 mol, with respect to 1 mol of indium, and, optionally, tin, and subsequently, the amorphous film is crystallized through annealing.

12. A transparent conductive film production method as described in claim 11, wherein the amorphous film is etched with a weakly acidic etchant and, subsequently, crystallized through annealing.

13. A transparent conductive film production method as described in claim 11, wherein annealing for crystallization is performed at 100 to 400° C.

14. A transparent conductive film production method as described in claim 11, wherein the transparent conductive film exhibits, after crystallization through annealing, an average transmittance at a wavelength of 400 to 500 nm of 85% or higher.

15. A transparent conductive film production method as described in claim 11, wherein the transparent conductive film exhibits a resistivity of $1.0\times10^{-4}$ to $1.0\times10^{-3}$ Ωcm.

16. A transparent conductive film production method as described in claim 11, wherein the film is deposited from a sputtering target having a molar ratio (y) of tin to indium of $(-2.9\times10^{-2}\mathrm{Ln}(x)-6.7\times10^{-2})$ or more and $(-2.0\times10^{-1}\mathrm{Ln}(x)-4.6\times10^{-1})$ or less, wherein x represents a molar ratio of barium to indium, with the case of y=0 being excluded.

17. A transparent conductive film production method as described in claim 16, wherein, from the relationship between oxygen partial pressure for depositing a film and resistivity of the film which has undergone annealing, an oxygen partial pressure which provides annealed film with the lowest resistivity is derived, and film deposition is performed at the derived oxygen partial pressure.

18. A transparent conductive film production method as described in claim 11, wherein the film is deposited from a sputtering target having a molar ratio (y) of tin to indium of $(-2.9\times10^{-2}\mathrm{Ln}(x)-6.7\times10^{-2})$ or more and $(-2.0\times10^{-1}\mathrm{Ln}(x)-4.6\times10^{-1})$ or less, and 0.22 or less, wherein x represents a molar ratio of barium to indium, with the case of y=0 being excluded.

19. A transparent conductive film production method as described in claim 18, wherein the film is deposited from a sputtering target having a molar ratio (y) of tin to indium of $(5.9\times10^{-2}\mathrm{Ln}(x)+4.9\times10^{-1})$ or less, wherein x represents a molar ratio of barium to indium.

20. A transparent conductive film production method as described in claim 19, wherein the film is deposited from a sputtering target having a molar ratio (y) of tin to indium of 0.08 or more, and a molar ratio (x) of barium to indium of 0.025 or less.

* * * * *